(12) United States Patent
Tanzawa

(10) Patent No.: US 6,456,541 B2
(45) Date of Patent: Sep. 24, 2002

(54) BOOSTER CIRCUIT FOR RAISING VOLTAGE BY SEQUENTIALLY TRANSFERRING CHARGES FROM INPUT TERMINALS OF BOOSTER UNITS TO OUTPUT TERMINALS THEREOF IN RESPONSE TO CLOCK SIGNALS HAVING DIFFERENT PHASES

(75) Inventor: Toru Tanzawa, Ebina (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/812,573

(22) Filed: Mar. 21, 2001

(30) Foreign Application Priority Data

Mar. 22, 2000 (JP) ........................................ 2000-080410

(51) Int. Cl.⁷ ................................................ G11C 7/00
(52) U.S. Cl. ............................. 365/189.11; 365/189.09; 365/226; 327/535; 327/536; 327/541
(58) Field of Search ...................... 365/189.11, 189.09, 365/226; 327/536, 541, 535

(56) References Cited

U.S. PATENT DOCUMENTS 5,856,918 A  * 1/1999 Soneda et al. ................. 363/30
6,333,670 B1 * 12/2001 Kono et al. .................. 327/541
2001/0017566 A1 * 8/2001 Nakahara .................... 327/536

FOREIGN PATENT DOCUMENTS

JP    362241200 A  * 10/1987
JP     03129744 A  *  6/1991
JP    410075568 A  *  3/1998
JP    411273379 A  * 10/1999

OTHER PUBLICATIONS

Umezawa, Akira, et al., "A 5–V Only Operation 0.6–μm Flash EEPROM with Row Decoder Scheme in Triple–Well Structure", IEEE Journal of Solid–State Circuits, vol. 27, No. 11. Nov. 1992.

Jinbo, Toshikatsu, et al., "A 5–V–Only 16–Mb Flash Memory with Sector Erase Mode", IEEE Journal Of Solid–State Circuits, vol. 27, No. 11. Nov. 1992.

* cited by examiner

Primary Examiner—Viet Q. Nguyen
(74) Attorney, Agent, or Firm—Banner & Witcoff, LTD.

(57) ABSTRACT

A booster circuit includes a plurality of booster units whose output terminals are respectively connected to the input terminals of the next-stage booster units, and an output circuit section. Each of the booster units sequentially transfers charges from the input terminal to the output terminal in response to clock signals to raise a positive or negative voltage input to a first-stage booster unit. Then, a node in which charges are left behind is reset by use of a reset signal after the charge transfer. The potential of the reset signal for turning ON the resetting transistor is created from the positive or negative boosted potential output from the output circuit section.

3 Claims, 15 Drawing Sheets

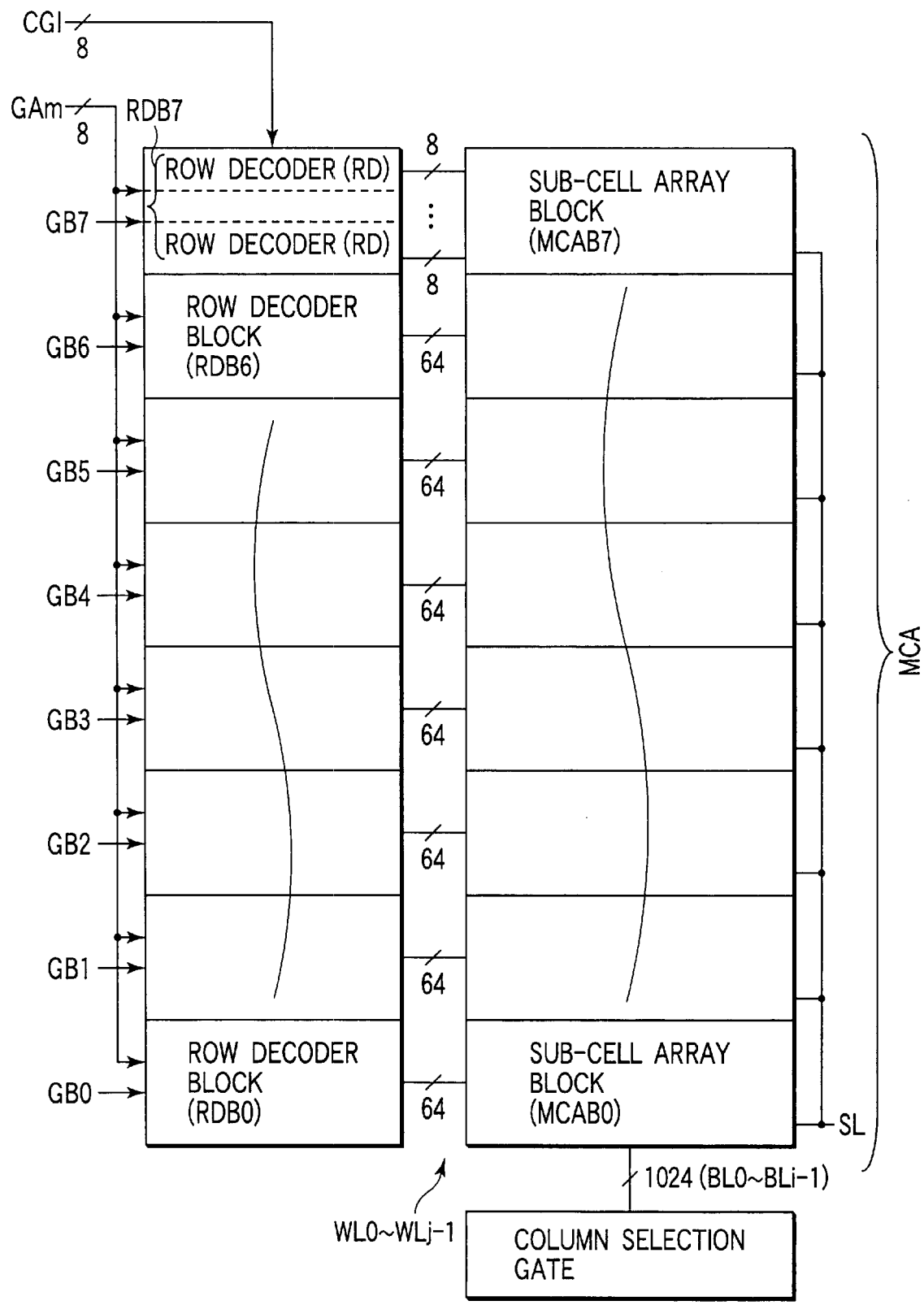
F I G. 12

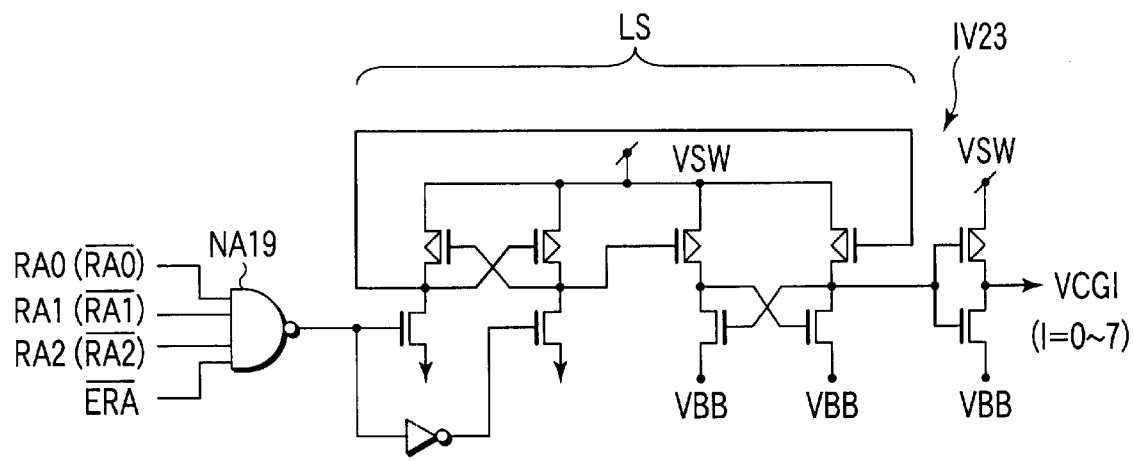
F I G. 14A
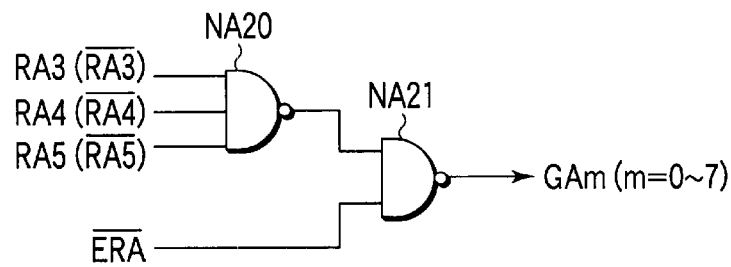
F I G. 14B
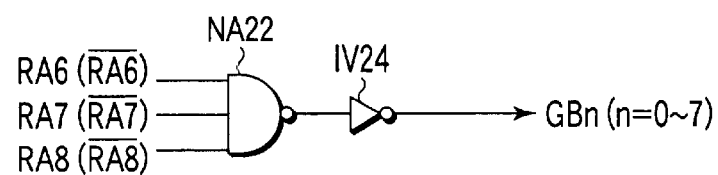
F I G. 14C

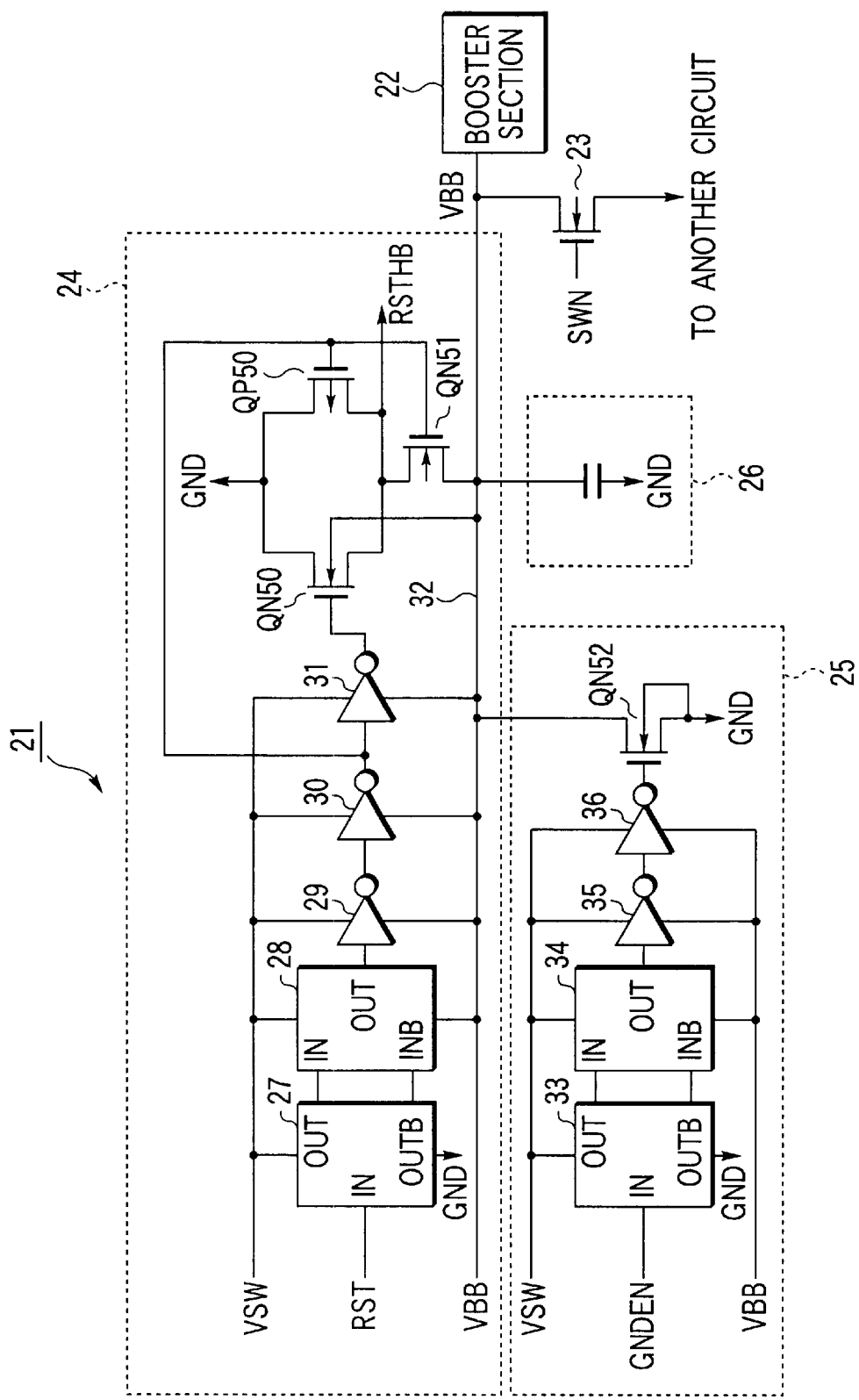
F I G. 15

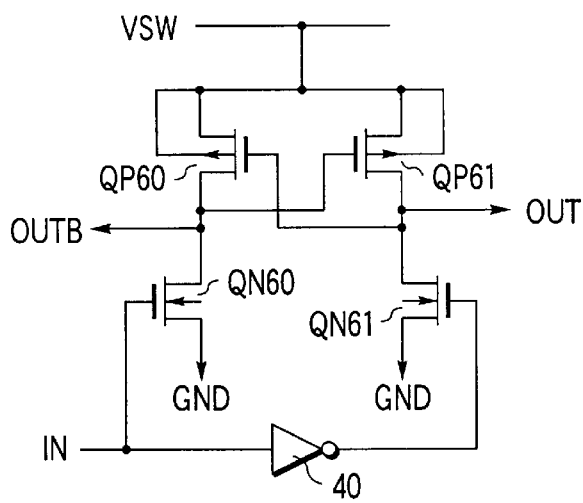
F I G. 16A
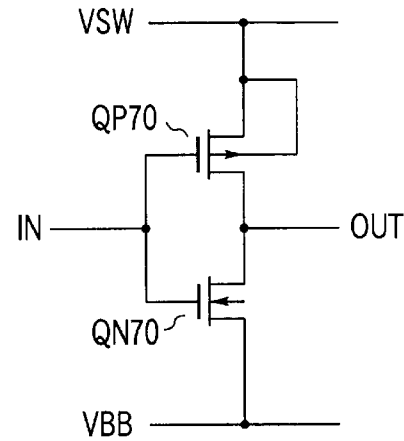
F I G. 17A
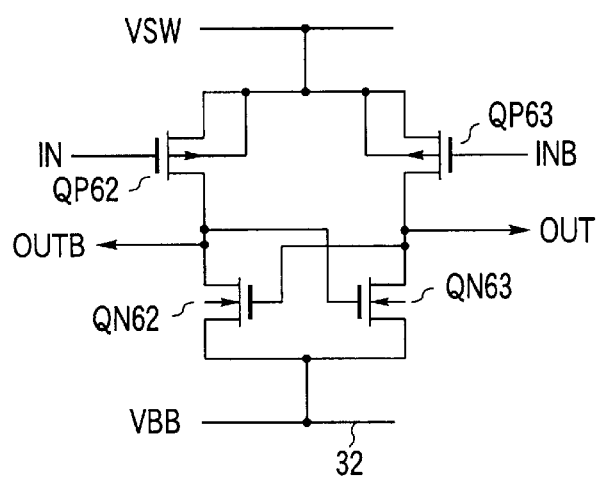
F I G. 16B
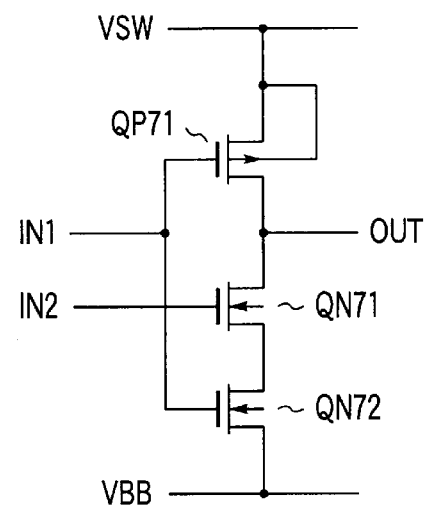
F I G. 17B

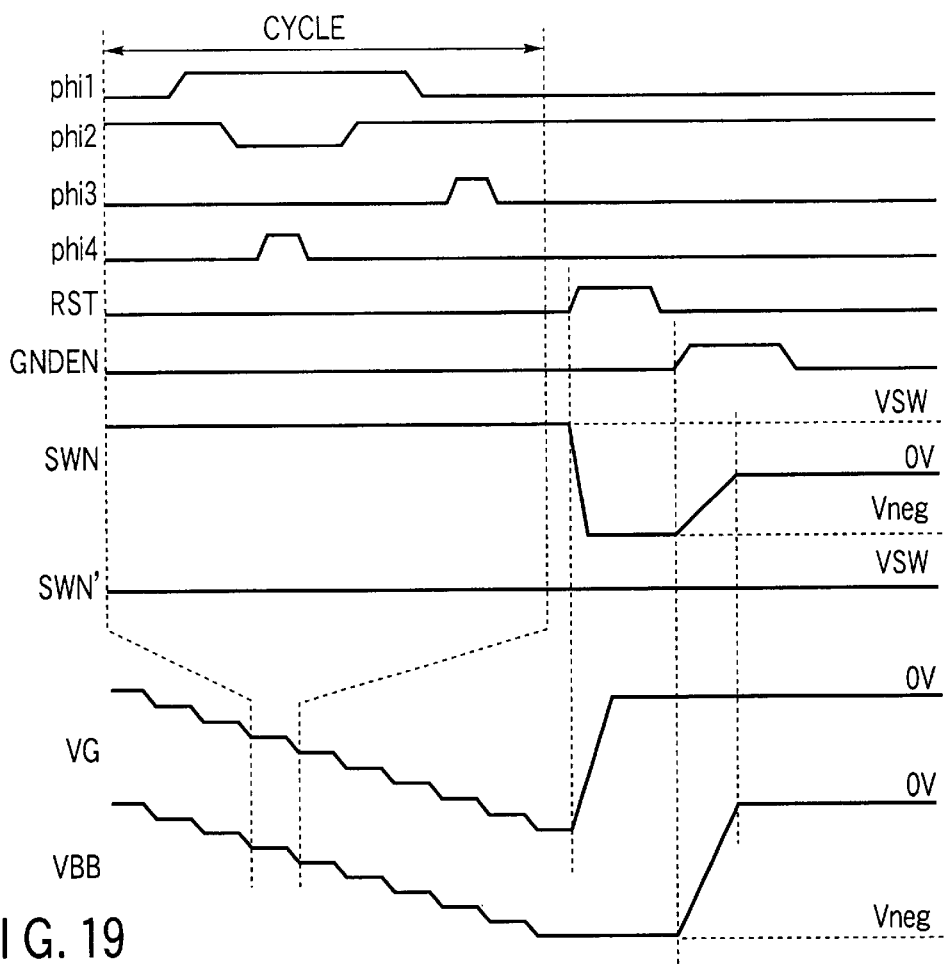
F I G. 19
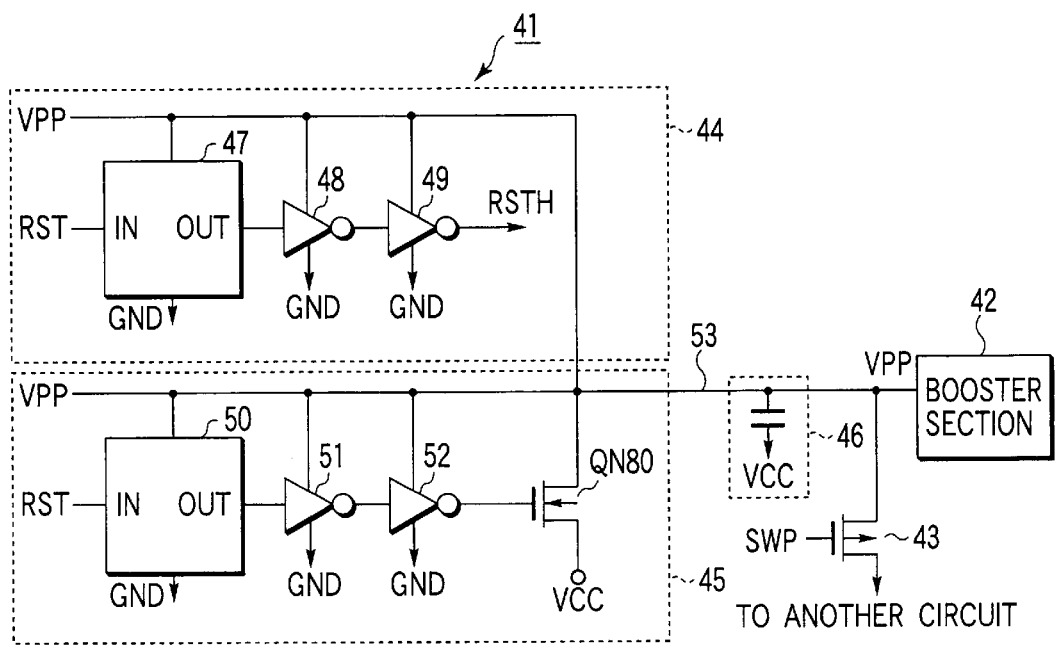
F I G. 20

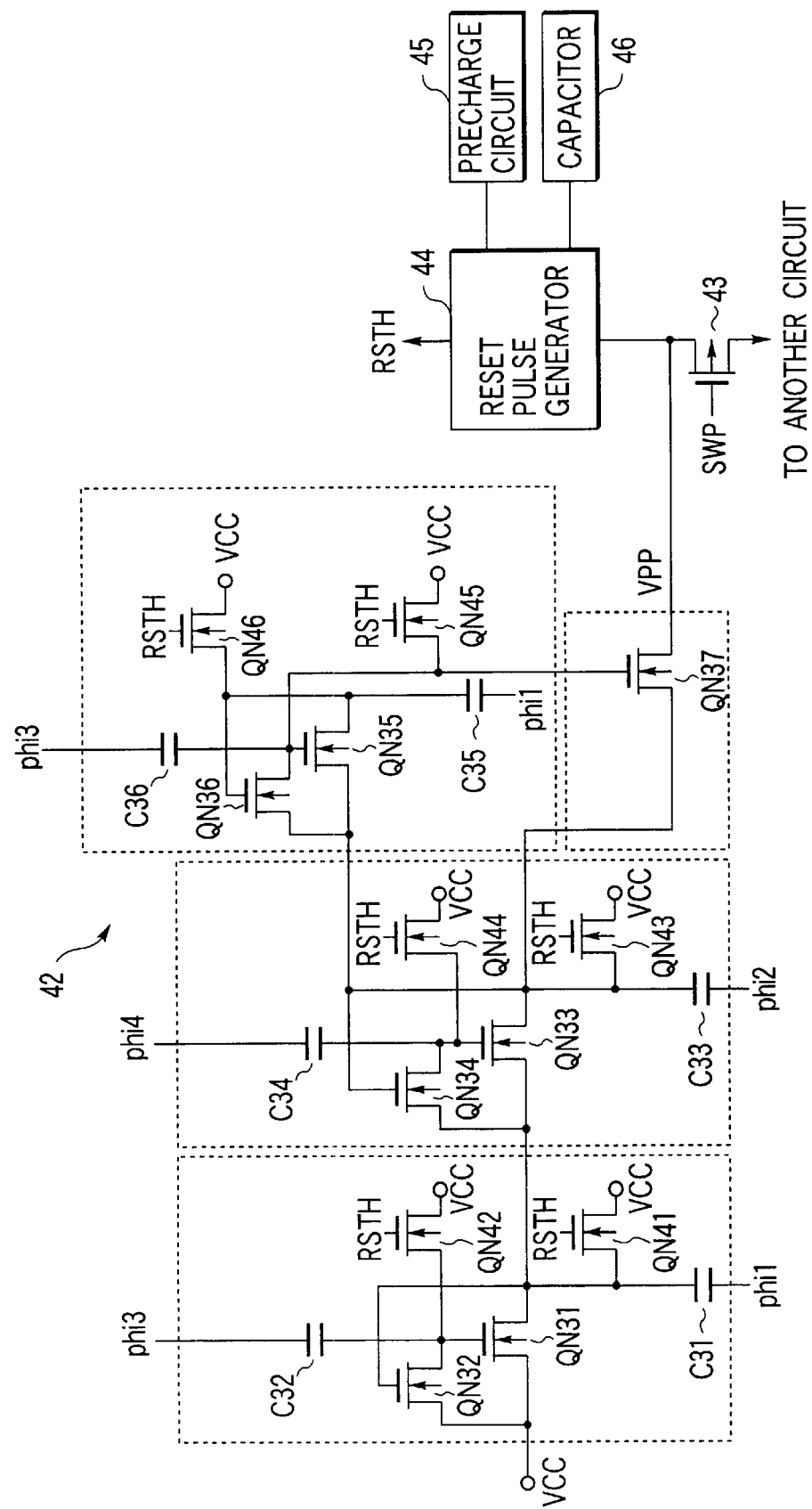
F I G. 21

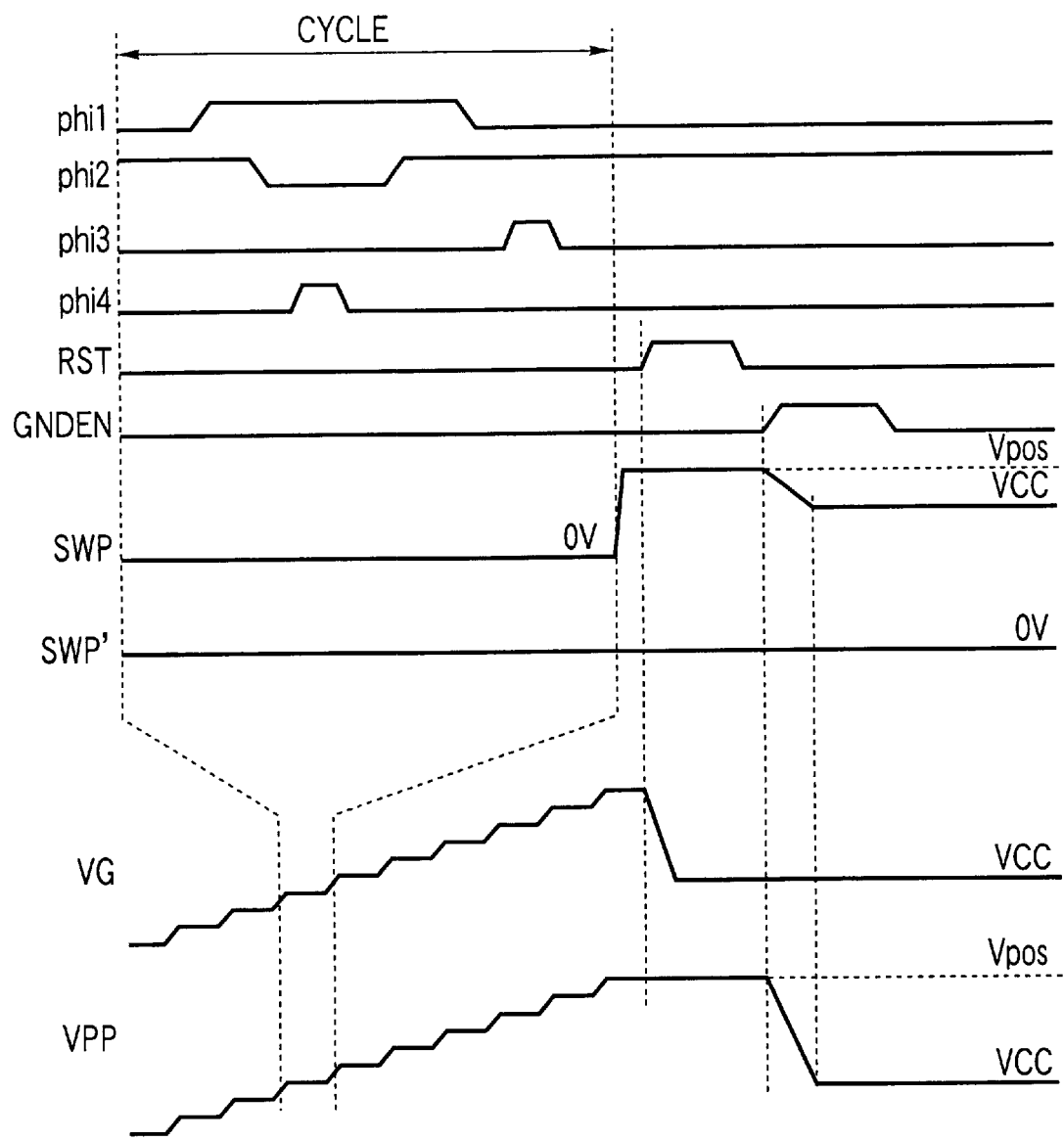
F I G. 22

US 6,456,541 B2

BOOSTER CIRCUIT FOR RAISING VOLTAGE BY SEQUENTIALLY TRANSFERRING CHARGES FROM INPUT TERMINALS OF BOOSTER UNITS TO OUTPUT TERMINALS THEREOF IN RESPONSE TO CLOCK SIGNALS HAVING DIFFERENT PHASES

CROSS-REFERENCE TO RELATED APPLICATIONS

This application is based upon and claims the benefit of priority from the prior Japanese Patent Application No. 2000-080410, filed Mar. 22, 2000, the entire contents of which are incorporated herein by reference.

BACKGROUND OF THE INVENTION

This invention relates to a booster circuit having a plurality of booster units (booster cells) whose output terminals are respectively connected to input terminals of the next-stage booster units, for raising voltage by sequentially transferring charges from the input terminals of the booster units to the output terminals thereof in response to clock signals of different phases and more particularly to the technique for resetting the gate nodes of transistors of the booster units in which charges are left behind.

FIG. 1 is a circuit diagram showing an example of the construction of a conventional booster circuit. The booster circuit is described in IEEE Journal of Solid-State Circuits. Vol. 27, No. 11, November 1992, pp. 1540 to 1546, A. Umezawa et al. "A 5-V-Only Operation 0.6-$\mu$m Flash EEPROM with Row Decoder Scheme in Triple Well Structure".

The booster circuit is constructed by booster units (booster cells) 11a, 11b, booster unit 12 and output circuit section 13. Each of the booster units 11a, 11b, 12 is constructed by two MOS transistors (MOSFETs) and two capacitors and the output terminals thereof are cascade-connected to the input terminals of the next-stage booster units.

That is, the booster unit 11a includes N-channel MOS transistors QN1, QN2 and capacitors C1, C2. One-side ends of the current paths of the MOS transistors QN1, QN2 are connected to a power supply terminal 14 to which a power supply voltage VCC is applied. The other end of the current path of the MOS transistor QN2 is connected to the gate of the MOS transistor QN1 and the gate thereof is connected to the other end-of the current path of the MOS transistor QN1. One electrode of the capacitor C1 is connected to the other end of the current path of the MOS transistor QN1 and the other electrode of the capacitor C1 is supplied with a clock signal phi1. Further, one electrode of the capacitor C2 is connected to the gate of the MOS transistor QN1 and the other electrode of the capacitor C2 is supplied with a clock signal phi3.

Likewise, the booster unit 11b includes N-channel MOS transistors QN3, QN4 and capacitors C3, C4. One-side ends of the current paths of the MOS transistors QN3, QN4 are connected to the other end of the current path of the MOS transistor QN1. The other end of the current path of the MOS transistor QN4 is connected to the gate of the MOS transistor QN3 and the gate thereof is connected to the other end of the current path of the MOS transistor QN3. One electrode of the capacitor C3 is connected to the other end of the current path of the MOS transistor QN3 and the other electrode of the capacitor C3 is supplied with a clock signal phi2. Further, one electrode of the capacitor C4 is connected to the gate of the MOS transistor QN3 and the other electrode of the capacitor C4 is supplied with a clock signal phi4.

The booster unit 12 includes N-channel MOS transistors QN5, QN6 and capacitors C5, C6. One-side ends of the current paths of the MOS transistors QN5, QN6 are connected to the other end of the current path of the MOS transistor QN3. The other end of the current path of the MOS transistor QN6 is connected to the gate of the MOS transistor QN5 and the gate thereof is connected to the other end of the current path of the MOS transistor QN5. One electrode of the capacitor C5 is connected to the other end of the current path of the MOS transistor QN5 and the other electrode of the capacitor C5 is supplied with the clock signal phi1. Further, one electrode of the capacitor C6 is connected to the gate of the MOS transistor QN5 and the other electrode of the capacitor C6 is supplied with a clock signal phi3.

The output circuit section 13 is constructed by an N-channel MOS transistor QN7. One end of the current path of the MOS transistor QN7 is connected to the other end of the current path of the MOS transistor QN3 and the gate thereof is connected to the gate of the MOS transistor QN5. Further, a positive voltage VPP obtained by raising or boosting the power supply voltage VCC is output from the other end of the current path of the MOS transistor QN7.

With the above construction, when four-phase clock signals phi1, phi2, phi3, phi4 of different phases are input as shown in the timing chart of FIG. 2, the power supply voltage VCC is sequentially raised by the booster circuits 11a, 11b for each cycle of the clock signals and supplied to one end of the current path of the MOS transistor QN7. Further, the boosted or raised voltage is supplied to and further raised by the booster unit 12 to produce voltage VG which is in turn supplied to the gate of the MOS transistor QN7. Thus, the gate of the transfer MOS transistor QN7 of the final stage is overdriven by the booster unit 12 so as to prevent a lowering in the output voltage VPP by the threshold voltage of the MOS transistor QN7.

In the above four-phase booster circuit, if a high voltage is left behind on the gate node of each MOS transistor in an electrically floating state after termination of the boosting operation, the transfer MOS transistors QN1, QN3, QN7 maintain the ON state at the time of re-boosting operation and the boosting operation cannot be effected.

Therefore, as shown in FIG. 3, the construction in which resetting N-channel MOS transistors QN8 to QN13 are respectively connected between the connection nodes of the gates of the MOS transistors QN1 to QN6 and the capacitors C1 to C6 and a ground node (GND) is proposed. A reset signal RST is supplied to the gates of the MOS transistors QN8 to QN13.

With the above construction, the gate voltage VG of the transfer MOS transistor QN7 of the final stage is raised for each cycle of the clock signals phi1 to phi4 as shown in the timing chart of FIG. 4 and the output voltage VPP is raised to a desired voltage. Then, if the reset signal RST is set to the high level at the time of termination of the boosting operation to turn ON the MOS transistors QN8 to QN13 and ground and discharge the connection nodes of the gates of the MOS transistors QN1 to QN6 and the capacitors C1 to C6, then the transfer MOS transistors QN1, QN3, QN7 can be forcedly turned OFF, thereby making it possible to prevent occurrence of an erroneous operation in the re-boosting operation.

Further, as shown in FIG. 5, the construction in which a resetting N-channel MOS transistor QN21 is connected between the output node of the power supply voltage VPP and the ground node GND in the booster circuit shown in FIG. 3 is also known in the art. After termination of the boosting operation, the output node is grounded and reset by supplying the reset signal RST to the gate of the MOS transistor QN21.

Thus, in the case of the booster circuit for generating the positive voltage, each node can be relatively easily reset by using the N-channel MOS transistor having a source grounded and a gate supplied with the reset signal having an amplitude between the ground potential and the power supply voltage VCC.

Further, in the above document, a booster circuit for generating a negative voltage as shown in FIG. 6 is also disclosed. The circuit includes P-channel MOS transistors QP1 to QP7 instead of the N-channel MOS transistors QN1 to QN7 shown in FIG. 1. The input terminal of the first-stage booster unit 11a, that is, one end of the current path of each of the MOS transistors QP1, QP2 is connected to the ground node GND instead of the power supply terminal 14.

Likewise, a booster circuit for generating a negative boosted voltage as shown in FIG. 7 and including P-channel MOS transistors QP1 to QP13 instead of the N-channel MOS transistors QN1 to QN13 shown in FIG. 3 can be provided.

If the booster circuit for generating a negative boosted voltage as shown in FIG. 7 is constructed, it is necessary to supply a reset signal RST with an amplitude between the ground potential and a preset negative boosted potential to the gates of the resetting P-channel MOS transistors QP8 to QP13. However, since the normal resetting signal RST is a signal whose amplitude lies between the ground potential and the power supply potential, the reset signal cannot be simply supplied to the gates of the P-channel MOS transistors QP8 to QP13. In order to create the rest signal RST', it is of course possible to provide a separate negative voltage generating circuit, but there occurs a problem that the circuit scale is made large and the control operation becomes complicated.

As described above, in the conventional booster circuit, it is required to create a reset signal having a large amplitude in order to reset the gate nodes of the transistors in which charges are left behind and a problem that the circuit scale is made large and the control operation becomes complicated occurs if a separate voltage generating circuit is used to create the reset signal.

BRIEF SUMMARY OF THE INVENTION

Accordingly, an object of this invention is to provide a booster circuit capable of suppressing an increase in the circuit scale and simplifying the control operation even if it is so constructed as to reset the gate nodes of transistors in which charges are left behind.

Another object of this invention is to provide a semiconductor memory device having a booster circuit capable of suppressing an increase in the circuit scale and simplifying the control operation even if it is so constructed as to reset the gate nodes of transistors in which charges are left behind.

The above object of this invention can be attained by a booster circuit comprising a booster unit including an input terminal to which a power supply potential or ground potential is applied, an output terminal for outputting a positive or negative boosted potential, first and second clock input terminals to which first and second clock signals of different phases are input, and a reset signal input terminal to which a reset signal is input, the booster unit transferring charges from the input terminal to the output terminal in response to the first and second clock signals and turning ON resetting transistors in response to the reset signal after termination of the charge transfer to reset the gate nodes of transistors in which charges are left behind; wherein the potential of the reset signal for turning ON the resetting transistor is created based on the positive or negative boosted potential output from the output terminal.

Further, the above object of this invention can be attained by a booster circuit comprising a plurality of booster units which includes a first-stage booster unit having an input terminal applied with a power supply potential or ground potential and whose output terminals are respectively connected to the input terminals of the next stage booster units; and an output circuit section controlled by an output potential of the final-stage booster unit, for transferring an output potential of one of the booster units which lies in the preceding stage of the final-stage booster unit; wherein each of the booster units includes first and second clock input terminals to which first and second clock signals of different phases are input and a reset signal input terminal to which a reset signal is input, transfers charges from the input terminal to the output terminal in response to the first and second clock signals and turns ON resetting transistors in response to the reset signal after termination of the charge transfer to reset the gate nodes of transistors in which charges are left behind and the potential of the reset signal for turning ON the resetting transistor is created based on the positive or negative boosted potential output from the output circuit section.

Further, the above object of this invention can be attained by a booster circuit comprising a plurality of booster units including a first-stage booster unit having an input terminal applied with a power supply potential or ground potential and whose output terminals are respectively connected to the input terminals of the next stage booster units; an output circuit section controlled by an output potential of the final-stage booster unit, for transferring an output potential of one of the booster units which lies in the preceding stage of the final-stage booster unit; a reset pulse generator for using a positive or negative boosted potential output from the output circuit section as one of power supply potentials to create a reset signal having an amplitude between the positive or negative boosted potential and a ground potential and supplying the reset signal to each of the booster units to reset the gate nodes of transistors of the booster units in which charges are left behind; and a discharge circuit for discharging the node of the reset pulse generator to which the positive or negative boosted potential is applied after resetting the gate nodes of the transistors in which charges are left behind.

The above object of this invention can be attained by a semiconductor memory device comprising a booster circuit for raising voltage by sequentially transferring charges in response to clock signals having different phases; and a circuit operated based on an output voltage of the booster circuit; wherein the booster circuit includes a plurality of booster units including a first-stage booster unit having an input terminal applied with a power supply potential or ground potential and whose output terminals are respectively connected to the input terminals of the next stage booster units, and an output circuit section controlled by an output potential of the final-stage booster unit, for transferring an output potential of one of the booster units which lies in the preceding stage of the final-stage booster unit, each of the booster units has first and second clock input terminals to which first and second clock signals of different phases are input and a reset signal input terminal to which a reset signal is input, transfers charges from the input terminal to the output terminal in response to the first and second clock signals and turns ON resetting transistors in response to the reset signal after termination of the charge transfer to reset the gate nodes of transistors in which charges are left behind, and the potential of the reset signal for turning ON the resetting transistor is created based on the positive or negative boosted potential output from the output circuit section.

Further, the above object of this invention can be attained by a semiconductor memory device comprising a booster circuit for raising voltage by sequentially transferring charges in response to clock signals having different phases; and a circuit operated based on an output voltage of the booster circuit; wherein the booster circuit includes a plurality of booster units including a first-stage booster unit having an input terminal applied with a power supply potential or ground potential and whose output terminals are respectively connected to the input terminals of the next stage booster units, an output circuit section controlled by an output potential of the final-stage booster unit, for transferring an output potential of one of the booster units which lies in the preceding stage of the final-stage booster unit, a reset pulse generator for using a positive or negative boosted potential output from the output circuit section as one of power supply potentials to create a reset signal having an amplitude between the positive or negative boosted potential and a ground potential and supplying the reset signal to each of the booster units to reset the gate nodes of transistors of the booster units in which charges are left behind, and a discharge circuit for discharging the node of the reset pulse generator to which the positive or negative boosted potential is applied after resetting the gate nodes of the transistors in which charges are left behind.

With the above construction, since the output voltage of the booster section is used for creating the reset signal, the booster circuit can be constructed by use of a simple logic circuit, it becomes unnecessary to use a separate negative voltage generating circuit, and the gate nodes of the transistors of the booster unit in which charges are left behind can be reset by a relatively simple control operation. Therefore, a booster circuit capable of suppressing an increase in the circuit scale and making the control operation simple and a semiconductor memory device having the booster circuit can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a block diagram specifically showing an extracted portion of the memory cell array and row decoders of the flash memory system shown in FIG. 8;

FIG. 14A is a circuit diagram showing an example of the construction of a VCG1 pre-decoder circuit for supplying a pre-decode signal to the row decoder in the circuit shown in FIG. 13;

FIG. 14B is a circuit diagram showing an example of the construction of a GAm pre-decoder circuit for supplying a pre-decode signal to the row decoder in the circuit shown in FIG. 13;

FIG. 14C is a circuit diagram showing an example of the construction of a GBn pre-decoder circuit for supplying a pre-decode signal to the row decoder in the circuit shown in FIG. 13;

FIG. 15 is a circuit diagram showing a four-phase type negative voltage generating booster circuit, for illustrating the booster circuit according to the first embodiment of this invention in detail;

FIG. 16A is a circuit diagram showing an example of the concrete construction of the circuit shown in FIG. 15 and an example of the construction of a high level shifter;

FIG. 16B is a circuit diagram showing an example of the concrete construction of the circuit shown in FIG. 15 and an example of the construction of a low level shifter;

FIG. 17A is a circuit diagram showing an example of the concrete construction of the circuit shown in FIG. 15 and an example of the construction of an inverter circuit;

FIG. 17B is a circuit diagram showing an example of the concrete construction of the circuit shown in FIG. 15 and another example of the construction of the inverter circuit;

FIG. 19 is a timing chart for illustrating the operations of the booster circuits shown in FIGS. 15 to 18;

FIG. 20 is a circuit diagram showing a four-phase type positive voltage generating booster circuit, for illustrating a booster circuit according to a second embodiment of this invention;

FIG. 21 is a circuit diagram for illustrating an example of the construction of a booster section in the circuit shown in FIG. 20;

FIG. 22 is a timing chart for illustrating the operations of the circuits shown in FIGS. 20 and 21.

DETAILED DESCRIPTION OF THE INVENTION

[First Embodiment]

A booster circuit according to a first embodiment of this invention and a semiconductor memory device having the booster circuit are explained by taking a flash memory system as an example.

Figure 8:
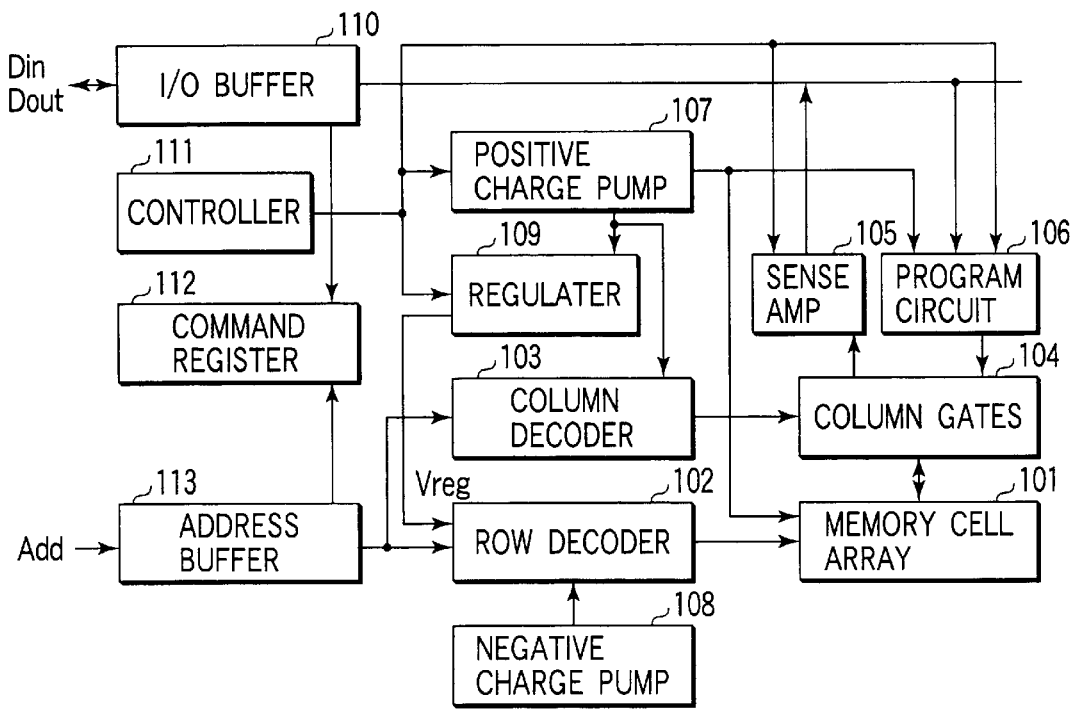
FIG. 8 is a block diagram showing the schematic construction of a flash memory system, for illustrating a booster circuit according to a first embodiment of this invention and a semiconductor memory device having the booster circuit.

FIG. 8 is a block diagram showing the schematic construction of the flash memory system. The flash memory system includes a memory cell array 101, row decoder 102, column decoder 103, column gates 104, sense amplifier 105, program circuit 106, positive charge pump 107, negative charge pump 108, regulator 109, I/O buffer 110, controller 111, command register 112, address buffer 113 and the like.

The address buffer 113 is supplied with an address Add of a memory cell subjected to the readout, program or erase process. The I/O buffer 110 outputs memory cell data Dout sensed and amplified by the sense amplifier 105 at the readout time and is supplied with program data Din at the program time to apply a program voltage from the program circuit 106 to the drain of the memory cell. The command register 112 holds a command which is input for controlling the program or erase process. The controller 111 generates various control signals based on the command held in the command register 112 and supplies the control signals to the sense amplifier 105, program circuit 106, positive charge pump 107 and regulator 109 to control the whole operation of the memory system. Further, the row decoder 102 selects one of word lines provided in the memory cell array 101 and the column decoder 103 selects one of the column gates 104 to connect one of bit lines provided in the memory cell array 101 to the sense amplifier 105 or program circuit 106. The positive charge pump 107 generates a positive voltage for the readout, program or erase process. An output voltage of the negative charge pump 108 is supplied to the row decoder 102 at the erase time to bias the word line selected for the erase process to a negative voltage. The regulator 109 generates a controlled voltage Vreg and supplies the voltage to the selected word line via the row decoder 102.

Figure 9:
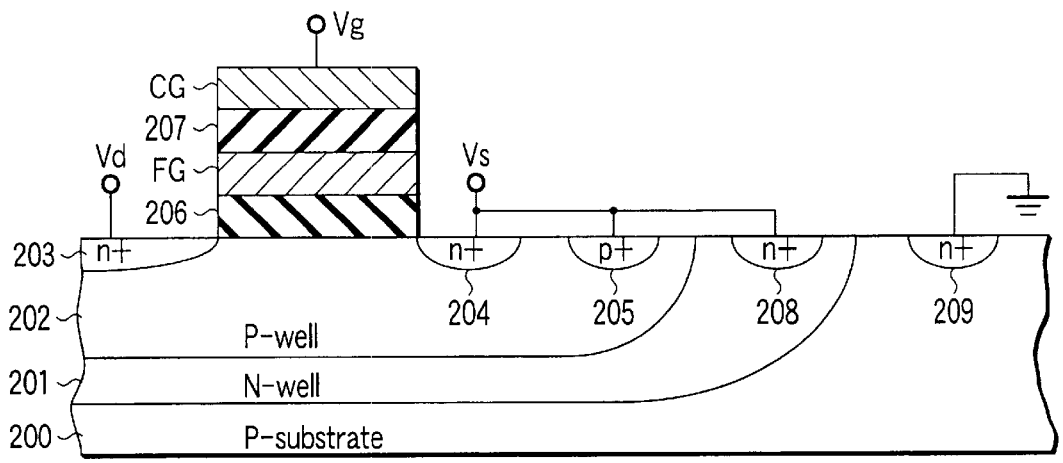
FIG. 9 is a cross sectional view of a memory cell in a memory cell array shown in FIG. 8.

FIG. 9 is a cross sectional view of a memory cell in the memory cell array 101 shown in FIG. 8. The memory cell (memory cell transistor) is constructed by a MOSFET having a so-called stacked gate structure in which a floating gate FG and control gate CG are stacked with an insulating film disposed therebetween. That is, in this example, an n-type well region 201 is formed on a p-type semiconductor substrate 200 and a p-type well region 202 is formed on the n-type well region 201. On the surface area of the p-type well region 202, an $n^+$-type impurity diffused region 203 acting as the drain region of the MOSFET, an $n^+$-type impurity diffused region 204 acting as the source region and an $p^+$-type impurity diffused region 205 are formed. On a portion of the substrate 200 which lies between the impurity diffused regions 203 and 204, a gate insulating film 206, floating gate FG, insulating film 207 and control gate CG are stacked. Further, on the surface area of the n-type well region 201, an $n^+$-type impurity diffused region 208 is formed and the impurity diffused region 208 is connected to the impurity diffused regions 204 and 205. In addition, a $p^+$-type impurity diffused region 209 is formed on the main surface of the substrate 200 and connected to the ground node.

In the above memory cell transistor, the threshold voltage as viewed from the control gate CG varies according to the number of electrons stored in the floating gate FG and data "0" or "1" is stored according to a variation in the threshold voltage.

Figure 10:
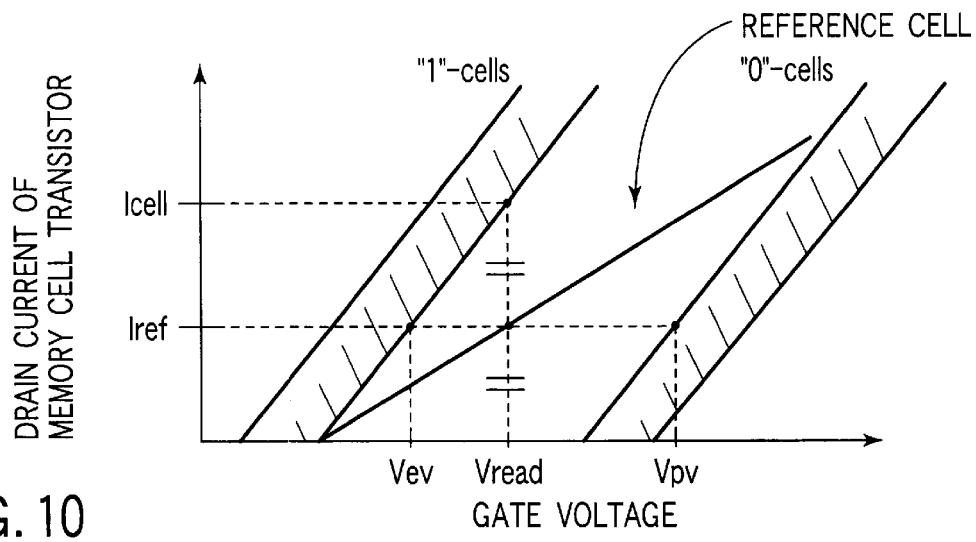
FIG. 10 is a characteristic diagram showing the relation between the control gate voltage and drain current of a memory cell transistor shown in FIG. 9.

FIG. 10 shows the relation between the control gate voltage and the drain current of the memory cell transistor shown in FIG. 9. In this example, a state in which the number of electrons stored in the floating gate FG is relatively large (that is, the threshold voltage Vt of the memory cell transistor is high) is defined as "0" data and a state in which the number of electrons is small is defined as "1" data. The bias condition for data readout, erase and program is shown in the following table 1.

TABLE 1

OPERATION VOLTAGE OF CELL

|    | Read | Program       | Erase    |
|----|------|---------------|----------|
| Vg | 5 V  | 9 V           | −7 V     |
| Vd | 1 V  | 5 V("0")      | Floating |
|    |      | 0 V("1")      |          |
| Vs | 0 V  | 0 V           | 10 V     |

The data readout operation is effected by respectively applying the voltage Vd (=1 V), voltage Vs (=0 V) and voltage Vg (=5 V) to the drain, source and control gate of the memory cell transistor and "1" or "0" of stored data is determined based on whether a cell current flows or not.

Further, the erase operation is simultaneously effected for a plurality of memory cells commonly having the source and p-type well region 202. Electrons flow from the floating gate FG to the substrate by an F–N tunnel phenomenon by setting the drain into an electrically floating state, setting the source voltage Vs to 10 V and setting the control gate voltage Vg to −7 V and memory cells to be subjected to the erase operation are all set to have data "1".

On the other hand, the program operation is effected for each bit line. The bit line of a cell into which "0" is to be programmed is biased to 5 V (drain voltage Vd=5 V) while the source voltage Vs is set at 0 V and the control gate voltage Vg is set at 9 V so as to cause high energy electrons generated by a channel hot electron phenomenon to be injected into the floating gate. At this time, if the bit line of a cell which is desired to be kept at "1" is set at 0 V (drain voltage Vd=0 V), no injection of electrons occurs and the threshold voltage Vt is not changed.

Next, in order to verify the program or erase operation, the program verify operation or erase verify operation is effected. The program verify operation is to read out "0" by setting the control gate voltage Vg to a higher voltage Vpv in comparison with the voltage set at the readout time. Then, the program operations and program verify operations are repeatedly and alternately effected and when all of the cells to be programmed are set to have "0", the program operation is terminated. Likewise, in the erase operation, the erase verify operation for reading out "1" by applying a lower voltage Vev in comparison with the voltage set at the readout time to the control gate CG so as to attain a sufficiently large cell current Icell.

Figure 11:
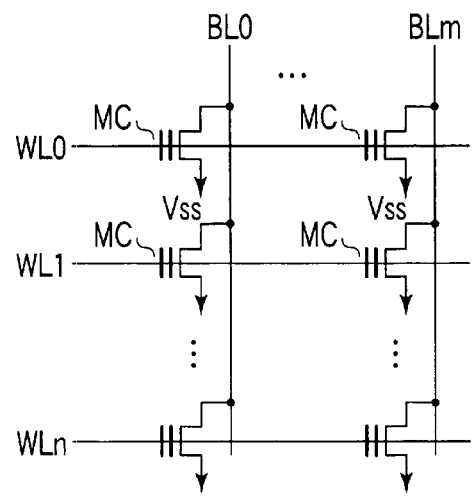
FIG. 11 is a circuit diagram showing an extracted portion of the memory cell array of FIG. 8 having the memory cell transistors shown in FIG. 9 arranged in an array form.

FIG. 11 shows an extracted portion of the memory cell array having the above memory cell transistors arranged in an array form. The control gates of the memory cell transistors MC on the same row are connected to a corresponding one of word lines WL0 to WLn. The drains of the memory cell transistors on the same column are connected to a corresponding one of bit lines BL0 to BLm and the sources of the memory cell transistors are commonly connected to a ground node Vss (source line).

FIG. 12 is a block diagram specifically showing an extracted portion of the memory cell array 101 and row decoder 102 of the flash memory system shown in FIG. 8. In this example, the construction of cell array block MCA commonly using one source line and a row decoder array associated therewith is shown.

The cell array block MCA of FIG. 12 has i×j memory cells, i bit lines BL0 to BL(i−1), j word lines WL0 to WL(j−1) and one source line SL. In this case, i=1024 and j=512, that is, the cell array block MCA has a construction of 512 word lines×1k bit lines and is constructed by eight sub-cell array blocks MCAB0 to MCAB7 each having a bit capacity of 8 kbytes. The sub-cell array blocks MCAB0 to MCAB7 commonly use the 1024 bit lines BL0 to BL(i−1) and one source line SL. A row decoder array RDA includes eight row decoder blocks RDB0 to RDB7 respectively provided for the eight sub-cell array blocks MCAB0 to MCAB7. Each of the row decoder blocks RDB0 to RDB7 includes eight row decoders RD and the whole portion of the row decoder array has 64 row decoders RD in total. Each row decoder Rd decodes pre-decode signals GAm, GBn, VCGl (m=0 to 7, n=0 to 7, l=0 to 7).

Figure 13:
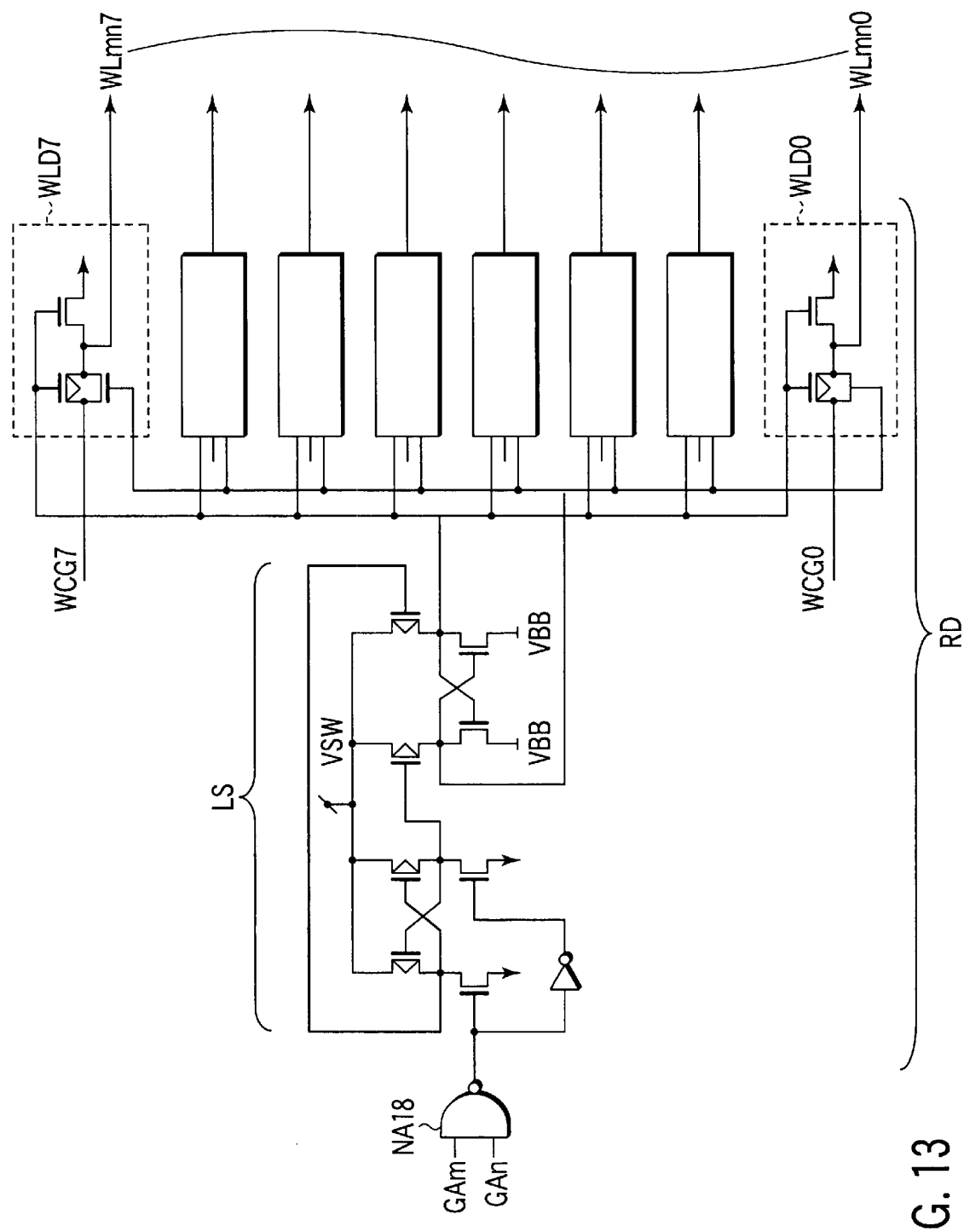
FIG. 13 is a circuit diagram showing one of the row decoders of FIG. 12 as a representative in detail.

FIG. 13 shows one of the row decoders RD of FIG. 12 as a representative in detail. The row decoder Rd includes a NAND gate NA18 supplied with the pre-decode signals GAm, GBn, a level shifter LS supplied with an output of the NAND gate NA18, and eight word line drivers WLD0 to WLD7 each supplied with outputs of the level shifter LS. The signal VCGl (l=0 to 7) is supplied to a corresponding one of the word line drivers as a word line driver voltage.

In the row decoder RD, a first-stage NMOS input type CMOS differential circuit of the level shifter LS is connected between a VSW node (for example, VSW=3 V) and the ground node. A next-stage PMOS input type CMOS differential circuit is connected between the VSW node and a VBB node (VBB is a negative voltage of −7.5 V). The word line drivers WLD0 to WLD7 are connected between the respective word line driver voltage sources (VCGl) and the ground node.

In the row decoder RD with the above construction, driving signals for eight word lines WLmnl (l=0 to 7) are created based on the pre-decode signals GAm, GBn, VCGl, and in the whole portion of the row decoder array, driving signals for 512 word lines WLmnl can be selectively created by a combination of m, n, l.

In this case, at the erase time, VBB is supplied as the word line driver voltage source signal VCGl as will be described later and the output potential of each row decoder RD of the selected row decoder block selected by the pre-decode signals GAm, GBn is set to VBB. On the other hand, the output potential of each row decoder of the non-selected row decoder block which is not selected is set to 0 V.

FIG. 14A shows an example of the construction of a VCGl pre-decoder circuit for creating a pre-decode signal VCGl in the circuit shown in FIG. 13.

The VCGl pre-decoder circuit includes a NAND gate NA19, level shifter LS and CMOS inverter (driver) IV23. Signals RA0 to RA2, $\overline{RA0}$ to $\overline{RA2}$ which are part of complementary internal row address signals RA0 to RA8, $\overline{RA0}$ to $\overline{RA8}$ and an erase mode signal $\overline{ERA}$ are supplied to the NAND gate NA19. An output of the NAND gate NA19 is input to the level shifter LS. An output of the level shifter LS is input to the CMOS inverter (driver) IV23.

In the VCGl pre-decoder circuit, the level shifter LS has substantially the same construction as the level shifter LS shown in FIG. 13 and the CMOS inverter IV23 is connected between the VSW node and the VBB node.

The VCGl pre-decoder circuit with the above construction decodes the signals RA0 to $\overline{RA2}$, $\overline{RA0}$ to $\overline{RA2}$ and outputs a pre-decode signal VCGl when the erase mode signal $\overline{ERA}$ is set in the non-activated state ("H" level) (at the readout/program time). On the other hand, if the erase mode signal $\overline{ERA}$ is set in the activated state ("L" level), it outputs VBB as the pre-decode signal VCGl.

FIG. 14B shows an example of the construction of a GAm pre-decoder circuit for creating a pre-decode signal GAm in the circuit shown in FIG. 13. The GAm pre-decoder circuit includes NAND gates NA20, NA21. Complementary internal row address signals RA3 to RA5, $\overline{RA3}$ to $\overline{RA5}$ are input to the NAND gate NA20. An output of the NAND gate NA20 and erase mode signal $\overline{ERA}$ are input to the NAND gate NA21.

The GAm pre-decoder circuit decodes the signals RA3 to RA5, $\overline{RA3}$ to $\overline{RA5}$ and outputs a pre-decode signal GAm when the erase mode signal $\overline{ERA}$ is set in the non-activated state ("H" level) (at the readout/program time). On the other hand, if the erase mode signal $\overline{ERA}$ is set in the activated state ("L" level), it outputs an "H" level as the pre-decode signal GAm.

FIG. 14C shows an example of the construction of a GBn pre-decoder circuit for creating a pre-decode signal GBn in the circuit shown in FIG. 13. The GBn pre-decoder circuit includes a NAND gate NA22 and inverter IV24. Complementary internal row address signals RA6 to RA8, $\overline{RA6}$ to $\overline{RA8}$ are input to the NAND gate NA22 and an output of the NAND gate NA22 is input to the inverter IV24.

The GBn pre-decoder circuit decodes the signals RA6 to RA8, $\overline{RA6}$ to $\overline{RA8}$ and outputs a pre-decode signal GBn. In this case, at the erase time, a 3-bit binary signal generated from a binary counter provided inside the chip is supplied as the signals RA6 to RA8, $\overline{RA6}$ to $\overline{RA8}$ as will be described later. Therefore, the pre-decode signal GBn functions as a row decoder block selection signal for alternatively selecting one of the eight row decoder blocks RDB0 to RDB7.

FIG. 15 illustrates the booster circuit according to the first embodiment of this invention in detail and shows a four-phase type negative voltage generating booster circuit for creating a negative voltage VBB which corresponds to the negative charge pump 108 of the flash memory system shown in FIG. 8. The circuit is a so-called voltage lowering circuit, but it is explained as a negative voltage generating booster circuit in the following description.

The four-phase type negative voltage generating booster circuit includes a reset signal generating section 21, booster section 22 and transistor section 23. The transistor section 23 is provided between the booster section 22 and another circuit, the ON/OFF state thereof is controlled by a switching signal SWN and it supplies or interrupts supply of a negative voltage VBB output from the booster section 22 to the other circuit acting as a load, for example, the row decoder RD.

The reset signal generating section 21 includes a reset pulse generator 24, discharge circuit 25 and capacitor 26. The reset pulse generator 24 includes a high-level shifter 27, low-level shifter 28, inverter circuits 29 to 31, N-channel MOS transistors QN50, QN51 and P-channel MOS transistor QP50. The output terminals of the high-level shifter 27, low-level shifter 28 and inverter circuits 29 to 31 are respectively connected to the input terminals of the next-stage circuits, that is, they are cascade-connected. The high-level shifter 27 is operated on voltage between the positive voltage VSW and the ground node GND and the low-level shifter 28 and inverter circuits 29 to 31 are operated on voltage between the positive voltage VSW and the negative voltage VBB output from the booster section 22. The positive voltage VSW is 3 V, for example, but may be set at the power supply voltage VCC or another voltage created based on the power supply voltage VCC. The reset signal RST is supplied to the input terminal IN of the high-level shifter 27 and signals output from the output terminals OUT, OUTB of the high-level shifter 27 are supplied to the input terminals IN, INB of the low-level shifter 28. A signal output from the output terminal OUT of the low-level shifter 28 is supplied to the input terminal of the inverter circuit 29, and an output signal of the inverter circuit 29 is supplied to the input terminal of the inverter circuit 30. An output signal of the inverter circuit 30 is supplied to the input terminal of the inverter circuit 31 and the gates of the MOS transistors QP50, QN51. An output signal of the inverter circuit 31 is supplied to the gate of the MOS transistor QN50.

One-side ends of the current paths of the MOS transistors QN50, QP50 are connected to the ground node GND and the other ends thereof are commonly connected to one end of the current path of the MOS transistor QN51. The other end of the current path of the MOS transistor QN51 is connected to a power supply line 32. The power supply line 32 is supplied with the negative voltage VBB generated from the booster section 22. An internal reset signal RSTHB is generated from the connection node of the current paths of the MOS transistors QN50, QN51, QP50 and supplied to the booster section 22. The internal reset signal RSTHB is set at 0 V when the reset signal RST is set at the low level and it is set at the VBB level when the reset signal is set at the high level.

The discharge circuit 25 includes a high-level shifter 33, low-level shifter 34, inverter circuits 35, 36 and N-channel MOS transistor QN52. The high-level shifter 33, low-level shifter 34 and inverter circuits 35, 36 are cascade-connected. The high-level shifter 33 is operated on voltage between the positive voltage VSW and the ground node GND and the low-level shifter 34 and inverter circuits 35, 36 are operated on voltage between the positive voltage VSW and the negative voltage VBB output from the booster section 22. A discharge signal GNDEN is supplied to the input terminal IN of the high-level shifter 33 and signals output from the output terminals OUT, OUTB of the high-level shifter 33 are supplied to the input terminals IN, INB of the low-level shifter 34. A signal output from the output terminal OUT of the low-level shifter 34 is supplied to the input terminal of the inverter circuit 35, and an output signal of the inverter circuit 35 is supplied to the input terminal of the inverter circuit 36. An output signal of the inverter circuit 36 is supplied to the gate of the MOS transistor QN52. One end of the current path of the MOS transistor QN52 is connected to the power supply line 32 and the other end thereof is connected to the ground node GND.

The capacitor 26 is connected between the power supply line 32 and the ground node GND. The capacitor 26 is a parasitic capacitor or a capacitor having a capacitance larger than or approximately equal to the whole capacitance associated with the gates of the P-channel MOS transistors in the booster section 22 to which the internal reset signal RSTHB is input. As the capacitor 26, a gate capacitor can be used and an electrostatic capacitor between two polysilicon layers, between two metal layers or between a polysilicon layer and a metal layer can be used.

A large parasitic capacitance such as a PN junction capacitance in a portion in which the power supply line 32 is wired or an overlap capacitance between the gate electrode of the MOS transistor and the source region may be associated with the power supply line 32 to which the negative voltage VBB is supplied in some cases. In such a case, the externally attached capacitor 26 becomes unnecessary. The reason why a capacitance larger than or approximately equal to the whole capacitance associated with the gates of the P-channel MOS transistors to which the internal reset signal RSTHB is input becomes necessary is that the ON-resistance of the P-channel MOS transistor can be suppressed to a sufficiently small value even when the negative voltage VBB on one electrode side of the capacitor 26 is divided by the gate capacitance at the reset time.

FIG. 16A is a circuit diagram showing an example of the construction of the high-level shifters 27, 33 in the circuit shown in FIG. 15. The high-level shifter includes P-channel MOS transistors QP60, QP61, N-channel MOS transistors QN60, QN61 and inverter 40. The positive voltage VSW is applied to the back-gates and one-side ends of the current paths of the MOS transistors QP60, QP61. The current paths of the MOS transistors QN60 and QN61 are respectively connected between the other ends of the current paths of the MOS transistors QP60, QP61 and the ground node GND. The gate of the MOS transistor QP60 is connected to a connection node (output terminal OUT) of the current paths of the MOS transistors QP61 and QN61. The gate of the MOS transistor QP61 is connected to a connection node (output terminal OUTB) of the current paths of the MOS transistors QP60 and QN60. The gate of the MOS transistor QN60 is connected to the input terminal IN. The input terminal of the inverter 40 is connected to the input terminal IN and the output terminal of the inverter 40 is connected to the gate of the MOS transistor QN61.

The high level of the reset signal RST or discharge signal GNDEN supplied to the input terminal IN is level-shifted to the positive voltage VSW and is output from the output terminal OUT or OUTB in a complementary fashion.

FIG. 16B is a circuit diagram showing an example of the construction of the low-level shifters 28, 34 in the circuit shown in FIG. 15. The low-level shifter includes P-channel MOS transistors QP62, QP63 and N-channel MOS transistors QN62, QN63. The positive voltage VSW is applied to the back-gates and one-side ends of the current paths of the MOS transistors QP62, QP63. The current paths of the MOS transistors QN62 and QN63 are respectively connected between the other ends of the current paths of the MOS transistors QP62, QP63 and the power supply line 32 to which the negative voltage VBB is applied. The input terminal IN is connected to the gate of the MOS transistor QP62 and the input terminal INB is connected to the gate of the MOS transistor QP63. The output terminals OUT, OUTB of the high-level shifter 27 or 33 are connected to the input terminals IN, INB. The gate of the MOS transistor QN62 is connected to a connection node (output terminal OUT) of the current paths of the MOS transistors QP63 and QN63. Further, the gate of the MOS transistor QN63 is connected to a connection node (output terminal OUTB) of the current paths of the MOS transistors QP62 and QN62.

The low level of each of the output signals of the high-level shifter supplied to the input terminals IN, INB is level-shifted to the negative voltage VBB and output from the output terminal OUT or OUTB in a complementary fashion. Therefore, the reset signal RST or discharge signal GNDEN which has passed through the high-level shifter and low-level shifter becomes a signal having an amplitude between the positive voltage VSW and the negative voltage VBB.

The low-level shifter shown in FIG. 16B has the output terminals OUT, OUTB, but in the case of the circuit construction shown in FIG. 15, only the output terminal OUT is used.

FIG. 17A is a circuit diagram showing an example of the construction of the inverter circuits 29 to 31, 35, 36 in the circuit shown in FIG. 15. The inverter circuit has a CMOS inverter construction operated on the positive voltage VSW and negative voltage VBB used as the power supply voltages. That is, the gates of a P-channel MOS transistor QP70 and N-channel MOS transistor QN70 are connected to an input terminal IN. The positive voltage VSW is applied to one end of the current path and the back-gate of the P-channel MOS transistor QP70. The negative voltage VBB is applied to one end of the current path of the N-channel MOS transistor QN70. The other ends of the current paths of the MOS transistors QP70, QN70 are commonly connected to an output terminal OUT.

With the above construction, a signal supplied to the input terminal IN is inverted and the inverted signal is output from the output terminal OUT with the high level of the inverted signal set to the positive voltage VSW and the low level thereof set to the negative voltage VBB.

FIG. 17B is a circuit diagram showing another example of the construction of the inverter circuits 29 to 31, 35, 36 in the circuit shown in FIG. 15. The inverter circuit has a P-channel MOS transistor QP71 and N-channel MOS transistors QN71, QN72. The current paths of the MOS transistors QP71, QN71, QN72 are serially connected. The positive voltage VSW is applied to one end of the current path and the back-gate of the P-channel MOS transistor QP71. The negative voltage VBB is applied to one end of the current path of the N-channel MOS transistor QN72. The gates of the MOS transistors QP71, QN72 are connected to a first input terminal IN1 and the gate of the MOS transistor QN71 is connected to a second input terminal IN2. A connection node of the current paths of the MOS transistors QP71, QN71 is connected to an output terminal OUT.

The inverter circuit with the above construction is used with the first and second input terminals IN1, IN2 short-circuited. With this construction, since the MOS transistor QN71 is connected between the MOS transistors QP71 and QN72, a higher withstanding voltage can be attained. The circuit is similar to the circuit shown in FIG. 17A in that a signal supplied to the short-circuited input terminals IN1, IN2 is inverted and the inverted signal is output from the output terminal OUT with the high level of the inverted signal set to the positive voltage VSW and the low level thereof set to the negative voltage VBB.

Figure 18:
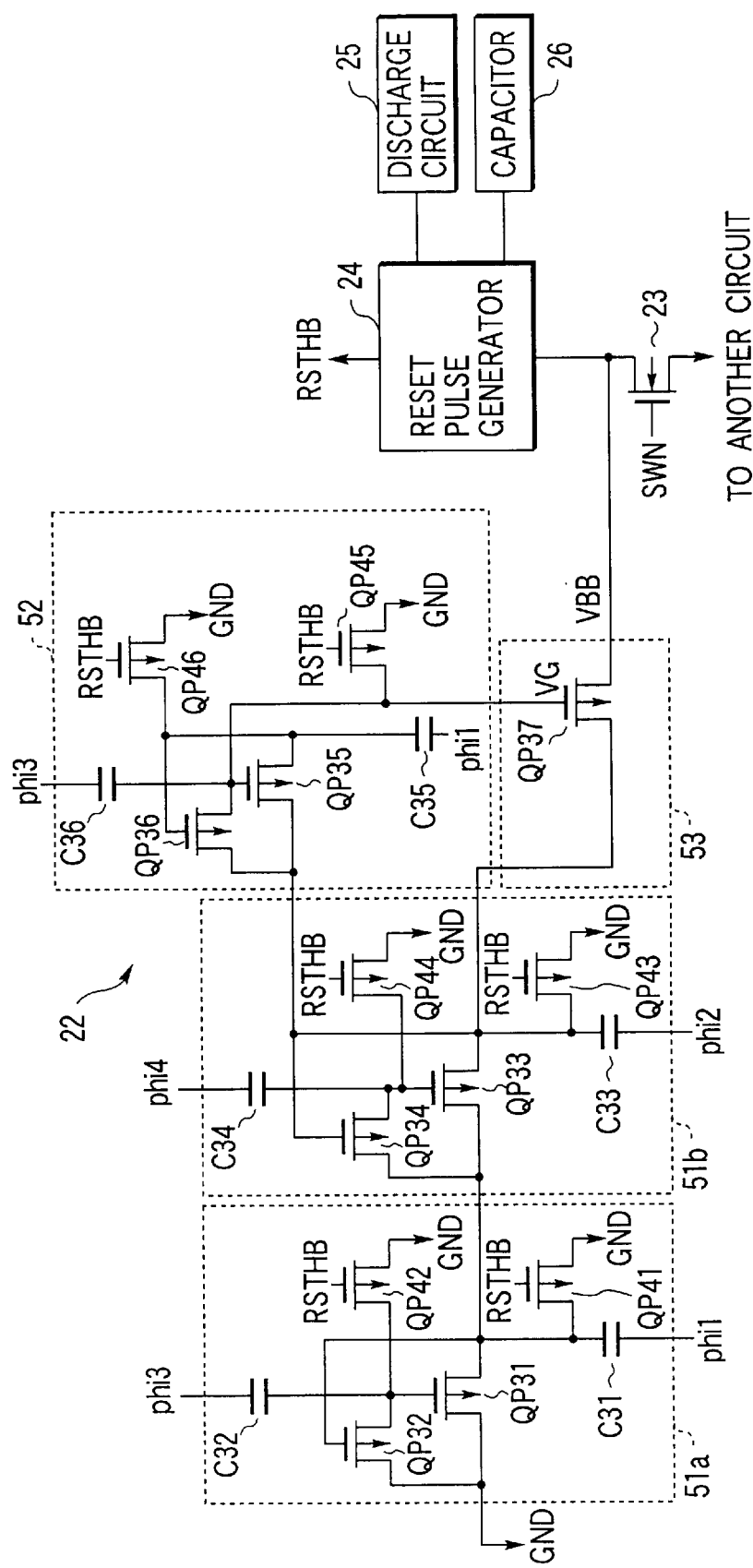
FIG. 18 is a circuit diagram for illustrating an example of the construction of a booster section in the circuit shown in FIG. 15.

FIG. 18 is a circuit diagram for illustrating an example of the construction of the booster section 22 in the circuit shown in FIG. 15. The booster section 22 includes booster units (booster cells) 51a, 51b, booster unit 52 and output circuit section 53. Each of the booster units 51a, 51b, 52 includes four MOS transistors (MOSFETs) and two capacitors and the output terminals of the booster units are respectively connected to the input terminals of the next-stage booster units.

That is, the booster unit 51a includes P-channel MOS transistors QP31, QP32, QP41, QP42 and capacitors C31, C32. One-side ends of the current paths of the MOS transistors QP31, QP32 are connected to the ground node GND. The other end of the current path of the MOS transistor QP32 is connected to the gate of the MOS transistor QP31 and the gate thereof is connected to the other end of the current path of the MOS transistor QP31. One electrode of the capacitor C31 is connected to the other end of the current path of the MOS transistor QP31 and the other electrode of the capacitor C31 is supplied with a clock signal phi1. One electrode of the capacitor C32 is connected to the gate of the MOS transistor QP31 and the other electrode of the capacitor C32 is supplied with a clock signal phi3. The current path of the MOS transistor QP41 is connected between the gate of the MOS transistor QP32 and the ground node GND and the gate of the MOS transistor QP41 is supplied with an internal reset signal RSTHB output from the reset signal generating section 21. Further, the current path of the MOS transistor QP42 is connected between the gate of the MOS transistor QP31 and the ground node GND and the gate of the MOS transistor QP42 is supplied with the internal reset signal RSTHB.

Likewise, the booster unit 51b includes P-channel MOS transistors QP33, QP34, QP43, QP44 and capacitors C33, C34. One-side ends of the current paths of the MOS transistors QP33, QP34 are connected to the other end of the current path of the MOS transistor QP31. The other end of the current path of the MOS transistor QP34 is connected to the gate of the MOS transistor QP33 and the gate thereof is connected to the other end of the current path of the MOS transistor QP33. One electrode of the capacitor C33 is connected to the other end of the current path of the MOS transistor QP33 and the other electrode of the capacitor C33 is supplied with a clock signal phi2. One electrode of the capacitor C34 is connected to the gate of the MOS transistor QP33 and the other electrode of the capacitor C34 is supplied with a clock signal phi4. The current path of the MOS transistor QP43 is connected between the gate of the MOS transistor QP34 and the ground node GND and the gate of the MOS transistor QP43 is supplied with the internal reset signal RSTHB. Further, the current path of the MOS transistor QP44 is connected between the gate of the MOS transistor QP33 and the ground node GND and the gate of the MOS transistor QP44 is supplied with the internal reset signal RSTHB.

The booster unit 52 includes P-channel MOS transistors QP35, QP36, QP45, QP46 and capacitors C35, C36. One-side ends of the current paths of the MOS transistors QP35, QP36 are connected to the other end of the current path of the MOS transistor QP33. The other end of the current path of the MOS transistor QP36 is connected to the gate of the MOS transistor QP35 and the gate thereof is connected to the other end of the current path of the MOS transistor QP35. One electrode of the capacitor C35 is connected to the other end of the current path of the MOS transistor QP35 and the other electrode of the capacitor C35 is supplied with the clock signal phi1. One electrode of the capacitor C36 is connected to the gate of the MOS transistor QP35 and the other electrode of the capacitor C36 is supplied with the clock signal phi3. The current path of the MOS transistor QP45 is connected between the gate of the MOS transistor QP35 and the ground node GND and the gate of the MOS transistor QP45 is supplied with the internal reset signal RSTHB. Further, the current path of the MOS transistor QP46 is connected between the gate of the MOS transistor QP36 and the ground node GND and the gate of the MOS transistor QP46 is supplied with the internal reset signal RSTHB.

The output circuit section 53 includes a P-channel MOS transistor QP37. One end of the current path of the MOS transistor QP37 is connected to the other end of the current path of the MOS transistor QP33 and the gate of the MOS transistor QP37 is connected to the gate of the MOS transistor QP35. The boosted negative voltage VBB is output from the other end of the current path of the MOS transistor QP37.

Figure 1:
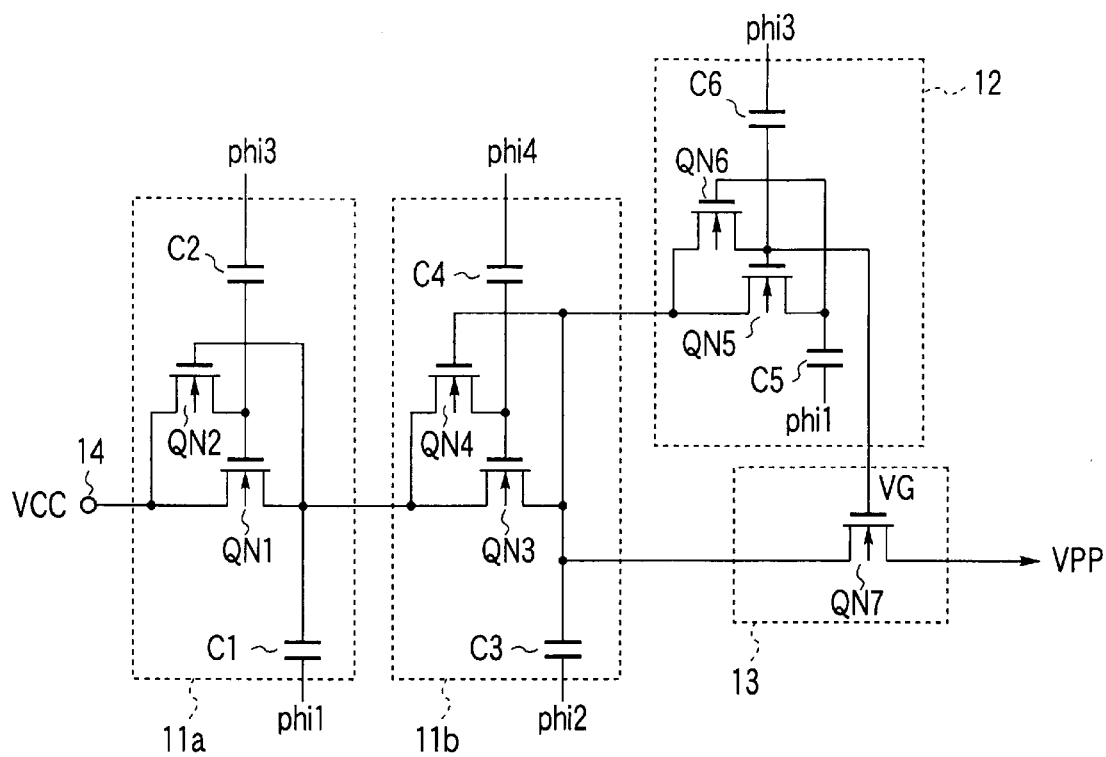
FIG. 1 is a circuit diagram showing an example of the construction of a conventional booster circuit.
Figure 2:
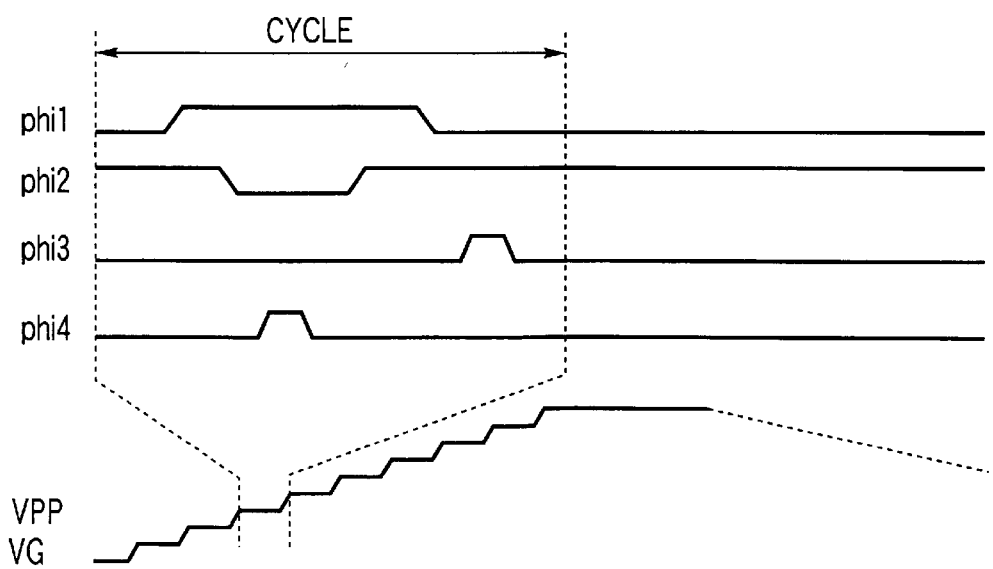
FIG. 2 is a timing chart for illustrating the operation of the booster circuit shown in FIG. 1.
Figure 3:
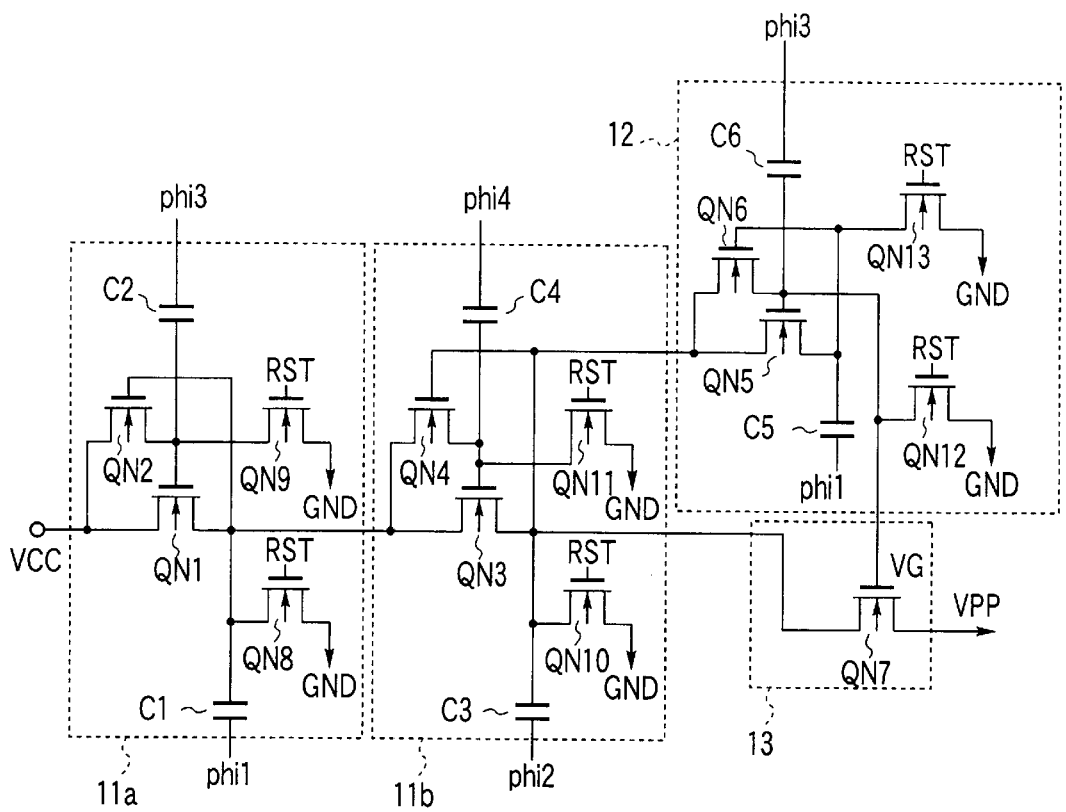
FIG. 3 is a circuit diagram showing another example of the construction of the conventional booster circuit.
Figure 4:
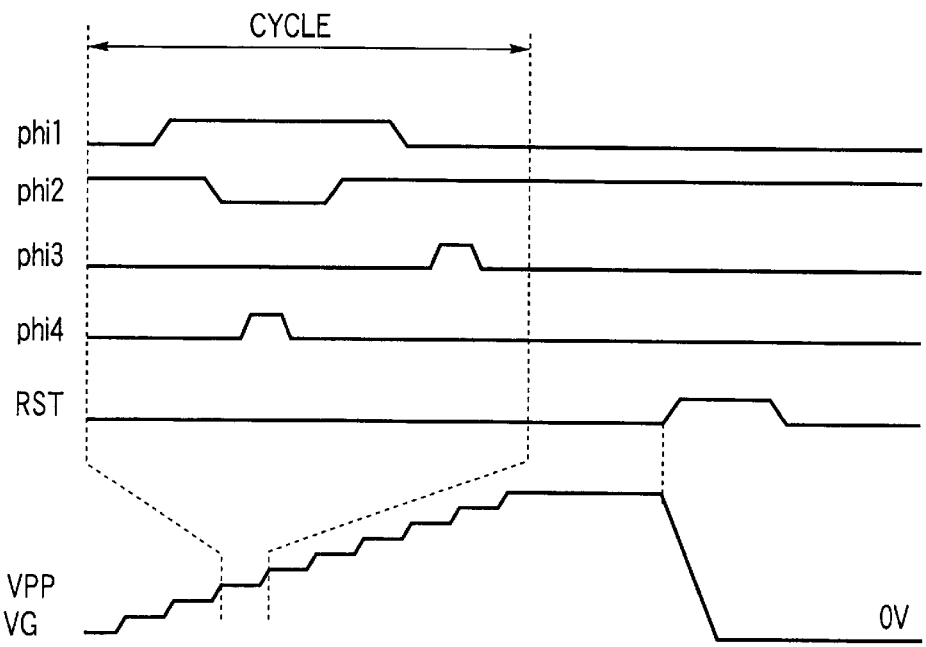
FIG. 4 is a timing chart for illustrating the operation of the booster circuit shown in FIG. 3.
Figure 5:
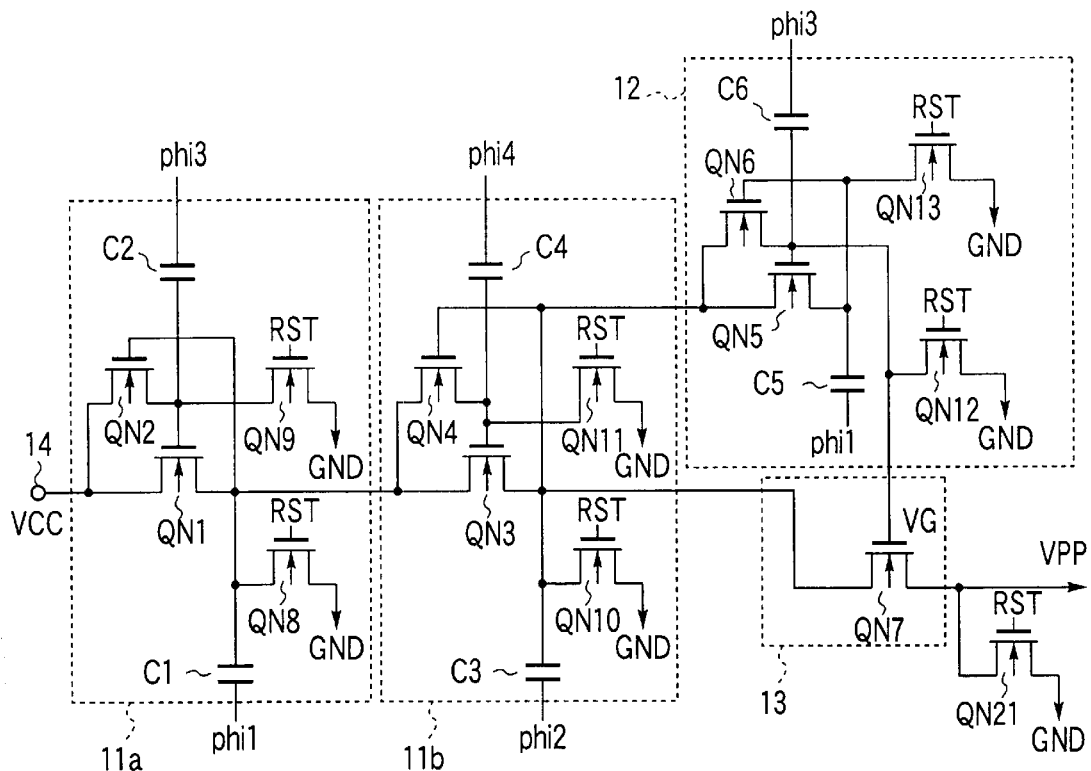
FIG. 5 is a circuit diagram showing still another example of the construction of the conventional booster circuit.
Figure 6:
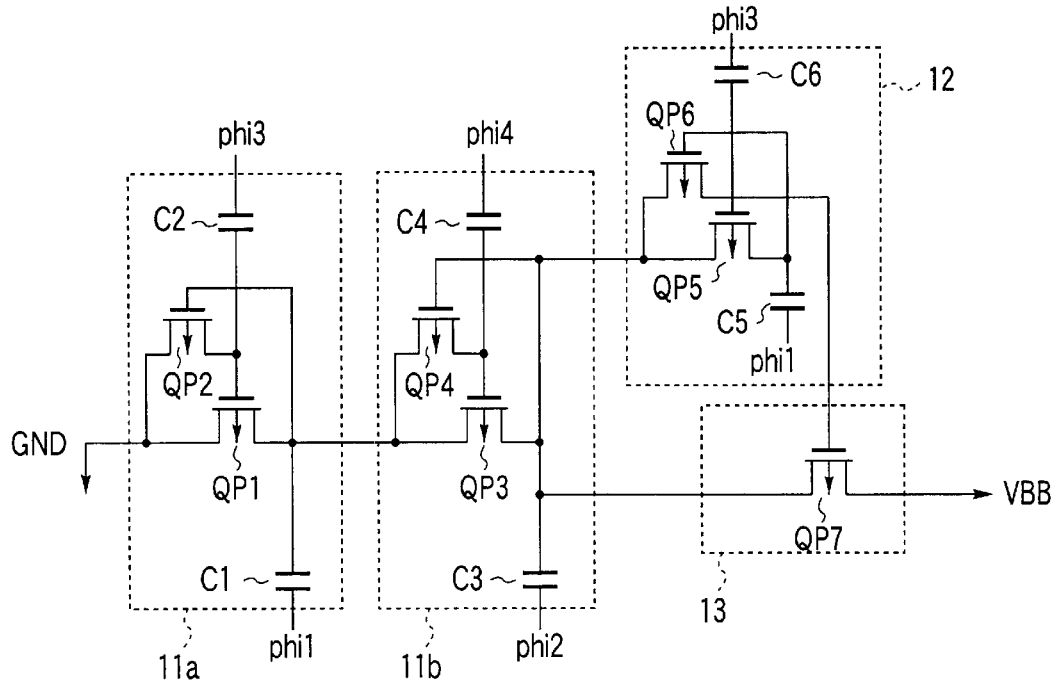
FIG. 6 is a circuit diagram showing an example of the construction of a conventional booster circuit for generating a negative voltage.
Figure 7:
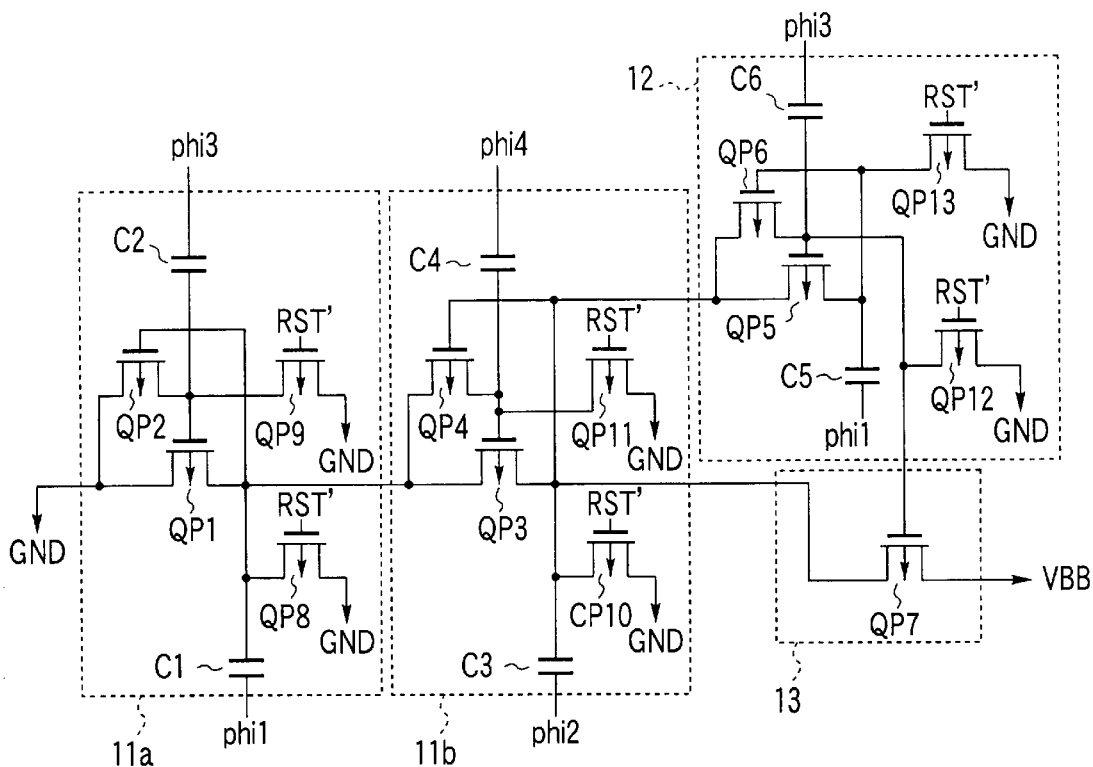
FIG. 7 is a circuit diagram showing another example of the construction of the conventional booster circuit for generating a negative voltage.

As described above, the circuit construction of the booster section 22 is basically the same as that of the circuit shown in FIG. 7, but in this circuit, an output signal of the reset signal generating section 21 is used as the internal reset signal RSTHB supplied to the gates of the resetting MOS transistors QP41 to QP46. The reset signal generating section 21 generates the internal reset signal RSTHB by using the negative voltage VBB output from the booster section 22.

FIG. 19 is a timing chart for illustrating the operation of the booster circuit shown in FIGS. 15 to 18. As shown in FIG. 19, when the clock signals phi1, phi2, phi3, phi4 are input as in the conventional booster circuit, the gate voltage VG of the MOS transistor QP37 and the output voltage VBB are gradually lowered for each cycle of the clock signals. If the output voltage VBB is lowered to a desired boosted level Vneg and a reset signal RST is input, then an internal reset signal RSTHB is created from the reset signal RST to drive the resetting MOS transistors QP41 to QP46 so as to set the gate potentials of the MOS transistors QP31 to QP37 to the ground potential (0 V). At this time, a switching signal SWN is set to the negative boosted level Vneg to interrupt the transistor section 23. At this time point, the output voltage VBB keeps the negative boosted level Vneg. After this, when a discharge signal GNDEN is set to the high level, the output voltage VBB and switching signal SWN are set to the ground potential (0 V).

In this case, if an attempt is made to activate the transistor section 23 irrespective of the timing of the reset signal RST, it is fixed at the positive voltage VSW as shown by SWN'.

With the above construction, since the output voltage VBB of the booster section 22 is used to generate the reset signal, it becomes easy to generate a reset signal having an amplitude between the ground potential and a preset negative boosted potential only by use of the electrostatic capacitance and some logic circuits. Therefore, it becomes unnecessary to use a separate negative voltage generating circuit and an increase in the circuit scale can be suppressed and the control operation can be simplified.

In the booster section 22 shown in FIG. 18, it is of course possible to connect a resetting P-channel MOS transistor between the output node of the negative voltage VBB and the ground node GND and supply an internal reset signal RSTHB to the gate of the above MOS transistor after termination of the boosting operation, thereby grounding and resetting the output node.

Further, in the first embodiment, the booster circuit used in the flash memory system is explained as an example, but this invention is not limited to a semiconductor memory device and can be generally applied to a semiconductor integrated circuit device.

[Second Embodiment]

FIGS. 20 to 22 are diagrams for illustrating a booster circuit according to a second embodiment of this invention and show an example in which this invention is applied to a four-phase type positive voltage generating booster circuit. In order to reset the gate node of an internal transistor (in which charges are left behind) of the positive voltage generating circuit, it is sufficient to use a signal having an amplitude of the power supply voltage VCC, but in this case, the efficiency is low since it is necessary to raise the potential of the gate node of the internal transistor from 0 V. Therefore, the gate nodes of the internal transistors are reset to the VCC level by applying the output voltage VPP of the booster circuit to the gates of the resetting MOS transistors. Thus, since the gate node of the internal transistor is boosted from the VCC level, an amount of charges required for the boosting operation can be reduced by VCC in comparison with a case wherein the gate node of the internal transistor is reset to 0 V.

The four-phase type positive voltage generating booster circuit shown in FIG. 20 includes a reset signal generating section 41, booster section 42 and transistor section 43. The transistor section 43 is connected between the output terminal of the booster section 42 and another circuit and ON/OFF-controlled by a switching signal SWP to supply or interrupt supply of the positive voltage VPP output from the booster section 42 to the other circuit used as a load.

The reset signal generating section 41 includes a reset pulse generator 44, discharge circuit 45 and capacitor 46. The reset pulse generator 44 includes a high-level shifter 47 and inverter circuits 48, 49. The output terminals of the high-level shifter 47 and inverter circuits 48, 49 are respectively connected to the input terminals of the next-stage circuits and they are operated on voltage between the positive boosted voltage VPP output from the booster circuit 42 and the ground node GND. The reset signal RST is supplied to the input terminal IN of the high-level shifter 47, a signal output from the output terminal OUT of the high-level shifter 47 is supplied to the input terminal of the inverter circuit 48, and a signal output from the inverter circuit 48 is supplied to the input terminal of the inverter circuit 49. An output signal of the inverter circuit 49 is output as the internal reset signal RSTH. The internal reset signal RSTH is set at 0 V when the reset signal RST is set at the low level and it is set at the VPP level when the reset signal is set at the high level.

The discharge circuit 45 includes a high-level shifter 50, inverter circuits 51, 52 and N-channel MOS transistor QN80. The output terminals of the high-level shifter 50, inverter circuits 51, 52 are respectively connected to the output terminals of the next-stage circuits and they are operated on voltage between the positive boosted voltage VPP output from the booster circuit 42 and the ground node GND. The discharge signal GNDEN is supplied to the input terminal IN of the high-level shifter 50, a signal output from the output terminal OUT of the high-level shifter 50 is supplied to the input terminal of the inverter circuit 51, and a signal output from the inverter circuit 51 is supplied to the input terminal of the inverter circuit 52. An output signal of the inverter circuit 52 is supplied to the gate of the MOS transistor QN80. One end of the current path of the MOS transistor QN80 is connected to a power supply line 53 to which the output voltage VPP of the booster section 42 is supplied and the other end thereof is connected to the power supply VCC.

The capacitor 46 is connected between the power supply line 53 and the power supply VCC. Like the first embodiment, the capacitor 46 is a parasitic capacitor or a capacitor having a capacitance larger than or approximately equal to the whole gate capacitance associated with the gates of the N-channel MOS transistors in the booster section 42 to which the internal reset signal RSTH is input. As the capacitor 46, a gate capacitor can be used or an electrostatic capacitor between two polysilicon layers, between two metal layers or between a polysilicon layer and a metal layer can be used.

A large parasitic capacitance such as a PN junction capacitance in a portion in which the power supply line 53 is wired or an overlap capacitance between the gate electrode of the MOS transistor and the source region may be associated with the power supply line 53 to which the boosted voltage VPP is supplied in some cases. In such a case, the externally attached capacitor 46 becomes unnecessary. The reason why a capacitance larger than or approximately equal to the whole gate capacitance associated with the gates of the N-channel MOS transistors to which the internal reset signal RSTH is input is necessary is that the ON-resistance of the N-channel MOS transistor can be suppressed to a sufficiently small value even when the voltage VPP on one electrode side of the capacitor 46 is divided by the gate capacitance at the reset time.

FIG. 21 is a circuit diagram for illustrating an example of the construction of the booster section 42 in the circuit shown in FIG. 20. The circuit includes N-channel MOS transistors QN31 to QN37, QN41 to QN46 instead of the P-channel MOS transistors QP31 to QP37, QP41 to QP46 in the circuit shown in FIG. 18. The internal reset signal RSTH output from the reset signal generating section 41 is supplied to the gates of the MOS transistors QN41 to QN46. Further, one-side ends of the current paths of the resetting MOS transistors QN41 to QN46 are connected to the power supply VCC instead of the ground node.

With this construction, as shown in the timing chart of FIG. 22, when the clock signals phi1, phi2, phi3, phi4 are input, the gate voltage VG of the MOS transistor QN37 and the output voltage VPP are gradually raised for each cycle of the clock signals. If a reset signal RST is input, an internal reset signal RSTH is created from the reset signal RST to drive the resetting MOS transistors QN41 to QN46 so as to set the gate potentials of the MOS transistors QN31 to QN37 to the boosted voltage VPP. At this time, a switching signal SWP is set to a positive boosted level Vpos to interrupt the transistor section 43. At this time point, the output voltage VPP keeps the positive boosted level Vpos. After this, when a discharge signal GNDEN is set to the high level, the output voltage VPP and switching signal SWP are set to the VCC level.

In this case, if an attempt is made to activate the transistor section 43 irrespective of the timing of the reset signal RST, it is fixed at 0 V as shown by SWP'.

Thus, in this embodiment, the gate nodes of the internal transistors are reset to the VCC level by applying the output voltage VPP of the booster section 42 to the gates of the resetting MOS transistors QN41 to QN46. Therefore, since the gate node of the internal transistor is started to be boosted from the VCC level, an amount of charges required for the boosting operation can be reduced by VCC in comparison with a case wherein the gate node of the internal transistor is reset to 0 V.

[Third Embodiment]

Figure 23:
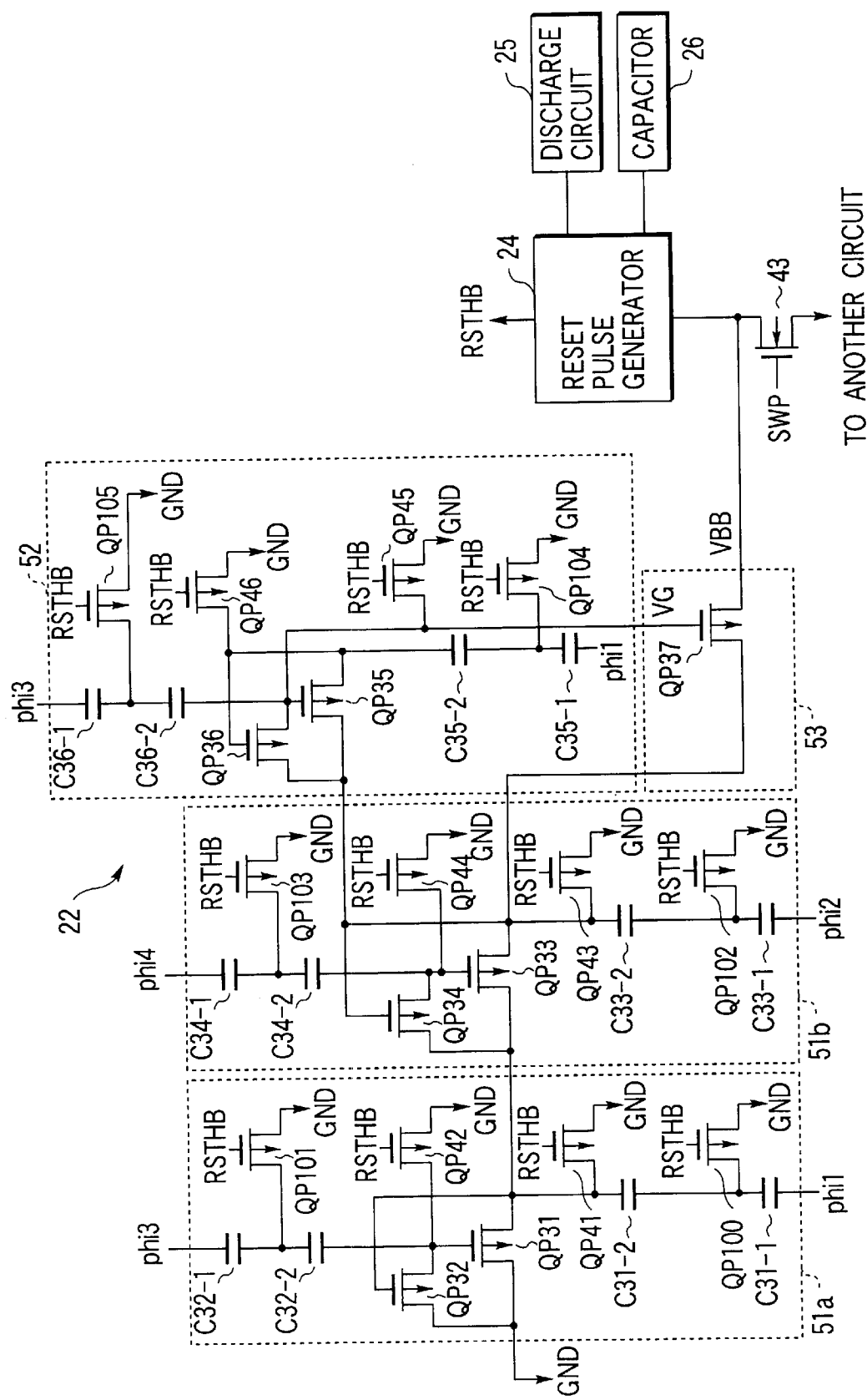
FIG. 23 is a circuit diagram showing another example of the construction of the booster section of the first embodiment shown in FIG. 15, for illustrating a booster circuit according to a third embodiment of this invention.

FIG. 23 illustrates a booster circuit according to a third embodiment of this invention and concretely shows another example of the construction of the booster section 22 of the first embodiment shown in FIG. 15. That is, the capacitors C31 to C36 in the circuit shown in FIG. 18 are respectively constructed by two series-connected capacitors C31-1, C31-2 to C36-1, C36-2 and resetting MOS transistors QP100 to QP105 are respectively connected between connection nodes of the capacitors C31-1, C31-2 to C36-1, C36-2 and the ground node GND.

The third embodiment is made by taking the following point into consideration. That is, an internal voltage of the booster circuit becomes higher than an output voltage thereof. Therefore, there occurs a possibility that the maximum input voltage may exceed the breakdown voltage of an insulating film of the capacitor when the thickness of the insulating film is small. Of course, it is possible to use a capacitor having an insulating film whose breakdown voltage is sufficiently high, but in this case, it cannot be formed in the same process as that for forming a capacitor having a thin insulating film as in a semiconductor memory device, for example, and the manufacturing process becomes complicated. Therefore, in this embodiment, the capacitors C31-1, C31-2 to C36-1, C36-1 with thin insulating films which are serially connected are used. If MOS capacitors are used as the capacitors C31-1, C31-2 to C36-1, C36-1, a PN junction is formed in each connection node of the two capacitors. It is necessary to reset the connection node without fail, but it cannot be reset if a reset signal having an amplitude of the power supply voltage VCC is used as in the prior art. However, the connection nodes of the capacitors C31-1, C31-2 to C36-1, C36-1 can be reset without fail by using a reset signal RSTHB having an amplitude between a boosted negative voltage VBB and a ground potential.

It is of course possible to construct each of the capacitors C31-1 to C36-1 in the circuit of FIG. 21 by use of two series-connected capacitors and connect a resetting MOS transistor between the connection node of the capacitors and the power supply VCC.

As described above, since it becomes unnecessary to use a separate voltage generating circuit by creating the reset signal of the four-phase type positive voltage generating booster circuit by use of the output voltage of the booster section and the circuit can be constructed by use of a simple logic circuit, the gate node of the internal transistor can be relatively easily reset.

As explained above, according to this invention, it is possible to provide a booster circuit which has a construction for resetting the gate node of the transistor having charges left behind therein and can suppress an increase in the circuit scale and in which the control operation can be simplified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A booster circuit comprising:

a booster unit including an input terminal to which one of a power supply potential and ground potential is applied, an output terminal for outputting one of positive and negative boosted potentials, first and second clock input terminals to which first and second clock signals of different phases are input, and a reset signal input terminal to which a reset signal is input, said booster unit transferring charges from the input terminal to the output terminal in response to the first and second clock signals and turning ON resetting transistors in response to the reset signal after termination of the charge transfer to reset gate nodes of transistors in which charges are left behind;

wherein the potential of the reset signal for turning ON the resetting transistor is created based on one of the positive and negative boosted potentials output from the output terminal.

2. The booster circuit according to claim 1, wherein said booster unit includes a first MOS transistor having a current path connected at one end thereof to the input terminal and connected at the other end thereof to the output terminal, a second MOS transistor having a current path connected at one end thereof to the input terminal and connected at the other end thereof to a gate of the first MOS transistor and a gate connected to the output terminal, a third resetting MOS transistor having a current path connected at one end thereof to the gate of the first MOS transistor and applied at the other end thereof with one of a power supply potential and ground potential and a gate supplied with the reset signal, a fourth resetting MOS transistor having a current path connected at one end thereof to the gate of the second MOS transistor and applied at the other end thereof with one of the power supply potential and ground potential and a gate supplied with the reset signal, a first capacitor having one electrode connected to the output terminal and the other electrode supplied with the first clock signal, and a second capacitor having one electrode connected to the gate of the first MOS transistor and the other electrode supplied with the second clock signal.

3. The booster circuit according to claim 1, further comprising a third capacitor having one electrode connected to the other electrode of the first capacitor and the other electrode supplied with the first clock signal; a fifth resetting MOS transistor having a current path connected at one end thereof to the other electrode of the first capacitor and applied at the other end thereof with one of the power supply potential and ground potential and a gate supplied with the reset signal; a fourth capacitor having one electrode connected to the other electrode of the second capacitor and the other electrode supplied with the second clock signal; and a sixth resetting MOS transistor having a current path connected at one end thereof to the other electrode of the second capacitor and applied at the other end thereof with one of the power supply potential and ground potential and a gate supplied with the reset signal.

* * * * *